United States Patent
Shin et al.

(10) Patent No.: US 12,013,754 B2
(45) Date of Patent: *Jun. 18, 2024

(54) NONVOLATILE MEMORY DEVICE AND MEMORY SYSTEM INCLUDING NONVOLATILE MEMORY DEVICE

(71) Applicant: SAMSUNG ELECTRONICS CO., LTD., Suwon-si (KR)

(72) Inventors: Beomkyu Shin, Seongnam-si (KR); Sungkyu Park, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/479,067

(22) Filed: Sep. 20, 2021

(65) Prior Publication Data
US 2022/0004457 A1 Jan. 6, 2022

Related U.S. Application Data

(63) Continuation of application No. 16/506,307, filed on Jul. 9, 2019, now Pat. No. 11,144,388.

(30) Foreign Application Priority Data

Dec. 11, 2018 (KR) .................. 10-2018-0159264

(51) Int. Cl.
*G06F 11/10* (2006.01)
*G06F 3/06* (2006.01)
(Continued)

(52) U.S. Cl.
CPC ........ *G06F 11/1068* (2013.01); *G06F 3/0604* (2013.01); *G06F 3/0659* (2013.01);
(Continued)

(58) Field of Classification Search
CPC ... G11C 16/10; G11C 13/0069; G11C 7/1006; G11C 2211/5647; G11C 11/5628;
(Continued)

(56) References Cited

U.S. PATENT DOCUMENTS 7,542,356 B2 6/2009 Lee et al.
7,549,011 B2 6/2009 Moschopoulos
(Continued)

FOREIGN PATENT DOCUMENTS

CN 103778961 5/2014
CN 107767910 3/2018
(Continued)

OTHER PUBLICATIONS

Notice of Allowance dated May 27, 2021 in corresponding U.S. Appl. No. 16/506,307.
(Continued)

*Primary Examiner* — April Y Blair
*Assistant Examiner* — Sazzad Hossain
(74) *Attorney, Agent, or Firm* — F. Chau & Associates, LLC

(57) ABSTRACT

A nonvolatile memory device performs a compare and write operation. The compare and write operation includes reading read data from memory cells, inverting first write data to generate second write data, adding a first flag bit to the first write data to generate third write data and adding a second flag bit to the second write data to generate fourth write data, performing a reinforcement operation on each of the third write data and the fourth write data to generate fifth write data and sixth write data, and comparing the read data with each of the fifth write data and the sixth write data and writing one of the fifth and sixth write data in the memory cells based on a result of the comparison.

20 Claims, 15 Drawing Sheets

(51) Int. Cl.

| | | |
|---|---|---|
| *G11C 29/52* | (2006.01) | |
| *G11B 20/18* | (2006.01) | |
| *G11C 7/10* | (2006.01) | |
| *G11C 11/56* | (2006.01) | |
| *G11C 13/00* | (2006.01) | |
| *G11C 16/10* | (2006.01) | |
| *G11C 29/42* | (2006.01) | |

(52) U.S. Cl.
CPC .......... *G06F 3/0679* (2013.01); *G11C 29/52* (2013.01); *G06F 3/065* (2013.01); *G11B 2020/1823* (2013.01); *G11C 7/1006* (2013.01); *G11C 11/5628* (2013.01); *G11C 13/0069* (2013.01); *G11C 16/10* (2013.01); *G11C 29/42* (2013.01); *G11C 2211/5646* (2013.01); *G11C 2211/5647* (2013.01)

(58) Field of Classification Search
CPC . G11C 2211/5646; G11C 29/42; G11C 29/52; G06F 3/065; G06F 3/0679; G06F 3/0659; G06F 3/0604; G06F 11/1068; G11B 2020/1823
See application file for complete search history.

(56) References Cited

U.S. PATENT DOCUMENTS

| | | | |
|---|---|---|---|
| 7,577,028 B2 | 8/2009 | Dover | |
| 7,876,626 B2 | 1/2011 | Mukai et al. | |
| 8,848,465 B2 | 9/2014 | Kim et al. | |
| 9,183,082 B2* | 11/2015 | Kim | G11C 17/02 |
| 9,183,138 B2 | 11/2015 | Yoo et al. | |
| 9,778,985 B1* | 10/2017 | Kim | G11C 16/10 |
| 9,979,416 B2 | 5/2018 | Ware et al. | |
| 10,359,950 B2 | 7/2019 | Kwon et al. | |
| 10,635,333 B2 | 4/2020 | Lee | |
| 11,144,388 B2* | 10/2021 | Shin | G06F 3/0625 |
| 2005/0276113 A1* | 12/2005 | Nakayama | G11C 29/40 365/185.22 |
| 2007/0011481 A1* | 1/2007 | Kwack | G11C 7/1051 713/330 |
| 2009/0237979 A1* | 9/2009 | Mukai | G11C 8/10 365/189.14 |
| 2010/0153821 A1 | 6/2010 | Keeler et al. | |
| 2011/0283166 A1 | 11/2011 | Kim et al. | |
| 2016/0054919 A1 | 2/2016 | Tao et al. | |
| 2016/0064051 A1 | 3/2016 | Ahn et al. | |
| 2017/0077957 A1 | 3/2017 | Kang | |
| 2018/0076828 A1 | 3/2018 | Kanno | |
| 2018/0294921 A1 | 10/2018 | Miyata et al. | |
| 2020/0183784 A1 | 6/2020 | Shin et al. | |

FOREIGN PATENT DOCUMENTS

| | | |
|---|---|---|
| CN | 108028668 | 5/2018 |
| CN | 108335715 | 7/2018 |
| EP | 3301816 | 4/2018 |
| JP | H05164607 | 6/1993 |
| KR | 10-0460708 | 11/2004 |
| KR | 10-2014-0051687 | 5/2014 |
| KR | 1020180020006 | 2/2018 |
| KR | 10-2018-0087496 | 8/2018 |

OTHER PUBLICATIONS

Advisory Action dated Apr. 14, 2021 in corresponding U.S. Appl. No. 16/506,307.
Final Office Action dated Jan. 13, 2021 in corresponding U.S. Appl. No. 16/506,307.
Office dated Jul. 10, 2020 in corresponding U.S. Appl. No. 16/506,307.

* cited by examiner

NONVOLATILE MEMORY DEVICE AND MEMORY SYSTEM INCLUDING NONVOLATILE MEMORY DEVICE

CROSS-REFERENCE TO RELATED APPLICATIONS

This U.S. non-provisional patent application is a continuation application of U.S. patent application Ser. No. 16/506,307 filed Jul. 9, 2019, which claims priority under 35 U.S.C. § 119 to Korean Patent Application No. 10-2018-0159264 filed on Dec. 11, 2018, in the Korean Intellectual Property Office, the disclosures of which are incorporated by reference herein in their entirety.

BACKGROUND

1. Technical Field

Embodiments of the inventive concept disclosed herein relate to a semiconductor memory, and more particularly relate to a nonvolatile memory device performing a compare and write operation and a memory system including the nonvolatile memory device.

2. Discussion of Related Art

A memory system may include a nonvolatile memory device that retains data stored therein even after power is no longer supplied. Examples of nonvolatile memory devices include a flash memory, a phase-change memory, a ferroelectric memory, a magnetic memory, and a resistive memory.

Among the nonvolatile memory devices, the flash memory has an erase-before-write characteristic in which an erase operation is first performed in a larger unit than a write operation for the purpose of performing the write operation. Due to the erase-before-write characteristic, the flash memory does not support an overwrite operation.

The phase-change memory, the ferroelectric memory, the magnetic memory, and the resistive memory support the overwrite operation. However, the overwrite operation may consume a great amount of power. Further, support of an overwrite operation may reduce integrity of data stored within a nonvolatile memory device.

Accordingly, it is necessary to reduce power consumption when performing an overwrite operation in a nonvolatile memory device and reinforce integrity of data within the nonvolatile memory device as a result of the overwrite operation.

SUMMARY

At least one embodiment of the inventive concept provides a nonvolatile memory device which reinforces integrity of data in a read operation while reducing power consumption in a write operation and a memory system including the nonvolatile memory device.

According to an exemplary embodiment of the inventive concept, a nonvolatile memory device includes a memory cell block including a plurality of memory cells, and a peripheral block that receives first write data to be written in the memory cells from an external device and performs a compare and write operation on the memory cells by using the first write data. The peripheral block performs the compare and write operation by reading read data from the memory cells, inverting the first write data to generate second write data, adding a first flag bit to the first write data to generate third write data and adding a second flag bit to the second write data to generate fourth write data, performing a reinforcement operation on each of the third write data and the fourth write data to generate fifth write data and sixth write data, and comparing the read data with each of the fifth write data and the sixth write data and writing one of the fifth and sixth write data in the memory cells based on a result of the comparison.

According to an exemplary embodiment of the inventive concept, a memory system includes a nonvolatile memory device including a plurality of memory cells, and a controller that performs a compare and write operation on the memory cells by using first write data to be written in the memory cells. The controller performs the compare and write operation by reading read data from memory cells, inverting the first write data to generate second write data, adding a first flag bit to the first write data to generate third write data and adding a second flag bit to the second write data to generate fourth write data, performing a reinforcement operation on each of the third write data and the fourth write data to generate fifth write data and sixth write data, and comparing the read data with each of the fifth write data and the sixth write data and writing one of the fifth and sixth write data in the memory cells based on a result of the comparison.

According to an exemplary embodiment of the inventive concept, a memory system includes a nonvolatile memory device including a plurality of memory cells, and a controller that performs a compare and write operation on the memory cells by using first write data to be written in the memory cells. The controller performs the compare and write operation by reading read data from the memory cells, performing a first encoding on the first write data to generate second write data, performing a second encoding on the second write data to generate third write data, inverting the third write data to generate fourth write data, adding a first flag bit to the third write data to generate fifth write data and adding a second flag bit to the fourth write data to generate sixth write data, and comparing the read data with each of the fifth write data and the sixth write data and writing one of the fifth and sixth write data in the memory cells based on a result of the comparison.

BRIEF DESCRIPTION OF THE FIGURES

The inventive concept will become apparent by describing in detail exemplary embodiments thereof with reference to the accompanying drawings.

DETAILED DESCRIPTION OF EXEMPLARY EMBODIMENTS

Figure 1:
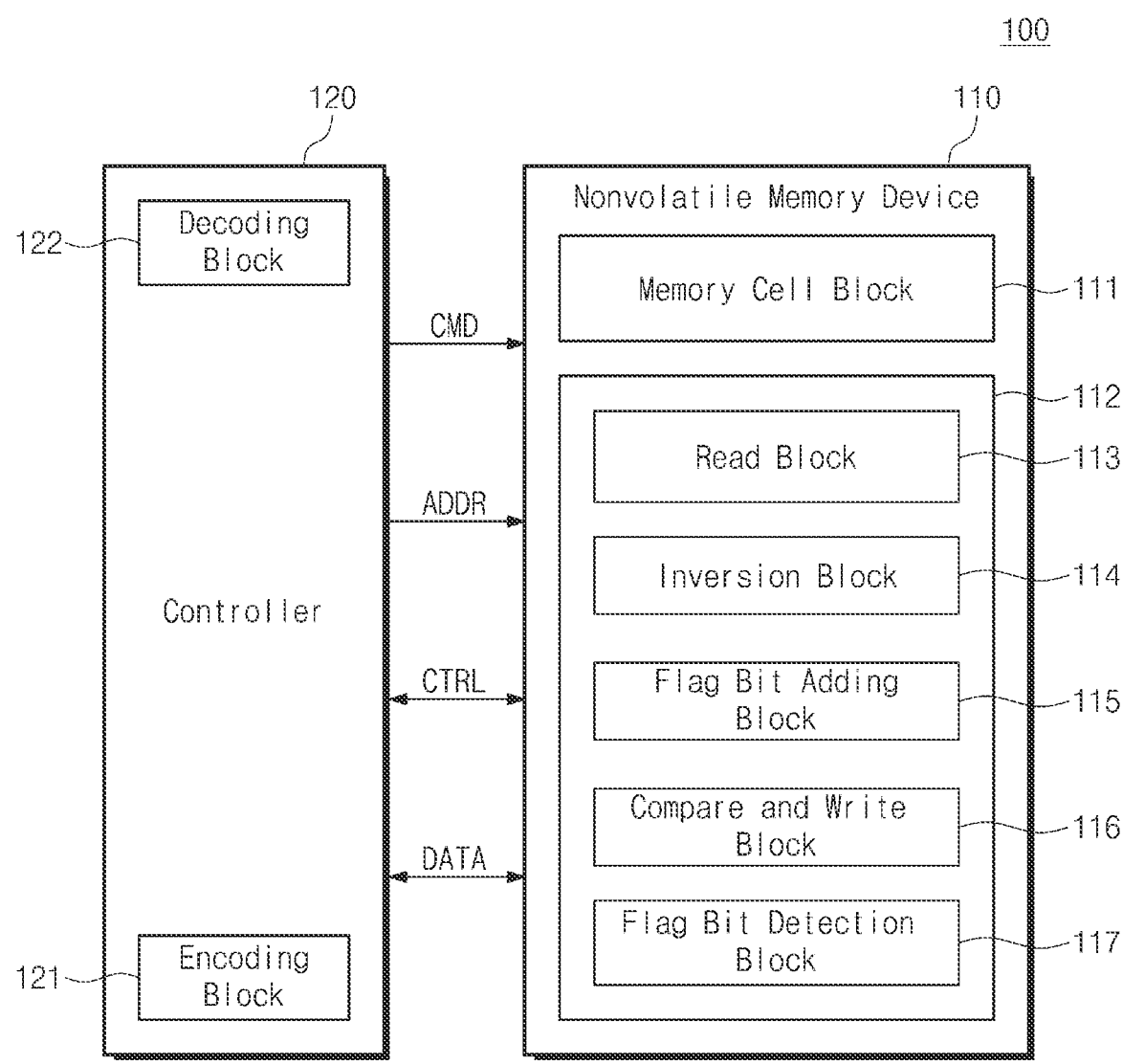
FIG. 1 is a block diagram illustrating a memory system according to an exemplary embodiment of the inventive concept.

Hereinafter, exemplary embodiments of the inventive concept are described in conjunction with accompanying drawings will be described. Below, details, such as detailed configurations and structures are provided to aid a reader in understanding embodiments of the inventive concept. Therefore, embodiments described herein may be variously changed or modified without departing from embodiments of the inventive concept. The same reference numeral indicates the same part through the accompanying drawings.

FIG. 1 is a block diagram illustrating a memory system 100 according to an exemplary embodiment of the inventive concept. Referring to FIG. 1, the memory system 100 includes a nonvolatile memory device 110 and a controller 120 (e.g., a control circuit). The nonvolatile memory device 110 may include a phase-change memory, a ferroelectric memory, a magnetic memory, or a resistive memory.

Even though power is turned off, the nonvolatile memory device 110 may maintain data stored therein. The nonvolatile memory device 110 may be used as a main storage device (e.g., a main memory) or an auxiliary storage device within a host system including the memory system 100.

The nonvolatile memory device 110 may receive a command CMD and an address ADDR from the controller 120. The nonvolatile memory device 110 may exchange control signals CTRL and data "DATA" with the controller 120. The nonvolatile memory device 110 may access memory cells referenced by the address ADDR, based on the command CMD and the control signals CTRL. The nonvolatile memory device 110 may exchange the data "DATA" being a result of a read operation of access operations with the controller 120 or may exchange the data "DATA" for a write operation of the access operations with the controller 120. For example, the nonvolatile memory device 110 may write data received from the controller 120 into the memory cells, read data from the memory cells, and output the read data to the controller 120.

The nonvolatile memory device 110 includes a memory cell block 111 and a peripheral block 112. The memory cell block 111 may include memory cells (e.g., nonvolatile memory cells). The memory cells may be arranged in rows and columns. The memory cells arranged in the rows and the columns may be accessed in units of various sizes. The access operation to the memory cells may include a write operation and a read operation. The write operation may include a set operation and a reset operation.

The peripheral block 112 is configured to access the memory cell block 111. The peripheral block 112 includes a read block 113, an inversion block 114, a flag bit adding block 115, a compare and write block 116, and a flag bit detection block 117. In an exemplary embodiment, the memory cell block 111 is located in a first region of the nonvolatile memory device 110, and the peripheral block 112 is located in a second region of the nonvolatile memory device 110 that is distinct from the first region. The first region may be substantially larger than the second region, so that the nonvolatile device 110 is mostly occupied by memory cells. The peripheral block 112 may be implemented by one or more logic circuits.

In response to the command CMD for requesting the read operation, the read block 113 may perform the read operation on selected memory cells referenced by the address ADDR, from among the memory cells of the memory cell block 111. For example, the read block 113 may read data from the selected memory cells by providing various voltages, various currents, or combinations of various voltages and various currents to the selected memory cells.

The inversion block 114 is configured to invert and output input data. In an exemplary embodiment, the inversion block 114 is implemented by one or more inverters or inverter circuits. For example, the inversion block 114 may invert the data "DATA" transmitted from the controller 120 to the nonvolatile memory device 110, or the inversion block 114 may invert data in the nonvolatile memory device 110 and may provide the inverted data to the controller 120 as the data "DATA".

The flag bit adding block 115 may add a flag bit or at least one replica flag bit to the data "DATA" provided from the controller 120 or data inverted by the inversion block 114. For example, the flag bit adding block 115 may add one flag bit indicating whether inversion was performed and may further add at least one identical replica flag bit. In an embodiment, the flag bit adding block 115 is implemented by a logic circuit. For example, the flag bit adding block 115 may convert N bit data into M bit data, where M is larger than N.

In an exemplary embodiment, in response to the command CMD for requesting the write operation, the compare and write block 116 performs a compare and write operation on selected memory cells referenced by the address ADDR, from among the memory cells of the memory cell block 111. In an exemplary embodiment, the compare and write block 116 generates two or more candidate data from the data "DATA" provided from the controller 120 and compares the two or more candidate data with existing data stored in the selected memory cells. In an exemplary embodiment, the compare and write block 116 is implemented by a logic circuit.

The compare and write block 116 may compare each of the two or more candidate data with existing data. The compare and write block 116 may count the number of positions at which the corresponding bits of each candidate data and the existing data are different. The compare and write block 116 may write compare candidate data corresponding to the smaller count in the selected memory cells.

In an exemplary embodiment, the compare and write block 116 selects candidate data corresponding to a count smaller than half of the number of bits of each candidate data and writes the selected candidate data in the selected memory cells. The compare and write block 116 may write the selected candidate data in the selected memory cells by providing various voltages, various currents, or combinations of various voltages and various currents to the selected memory cells. For example, if the existing data and candidate data are 8 bit data, first candidate data among the candidate data has 3 bits that differ from the existing data and second candidate data among the candidate data has 5 bits that differ from the existing data, then the first candidate data would be selected.

The flag bit detection block 117 may detect and remove a flag bit or flag bits from data which are read from the selected memory cells of the memory cell block 111 by the read block 113. In an embodiment, the flag bit detection block 117 is implemented by a logic circuit. The flag bit detection block 117 may provide data to the inversion block 114 or to the controller 120, based on a value of a flag bit or values of flag bits. For example, flag bit(s) may indicate whether the data needs to be inverted before it is provided to the controller 120.

The controller 120 may enable the nonvolatile memory device 110 to perform the write operation or the read operation. The controller 120 may transmit the command CMD and the address ADDR to the nonvolatile memory device 110. The controller 120 may exchange the control signals CTRL and the data "DATA" with the nonvolatile memory device 110. The controller 120 may enable the nonvolatile memory device 110 to perform the write operation, the read operation, or a check operation.

The controller 120 may include or control an encoding block 121 (e.g., an encoder or encoding circuit) and a decoding block 122 (e.g., a decoder or decoding circuit). The encoding block 121 may perform error correction encoding on data which the controller 120 will transmit to the nonvolatile memory device 110 in the write operation. The encoding block 121 may add a parity to original data by performing error correction encoding. The parity may be redundant information generated from performing an operation on the original data. The parity may include one or more bits and may provide an error correction function. For example, an error correction operation may be performed on data having the parity to restore the original data. The data "DATA" encoded by the encoding block 121 may be transmitted to the nonvolatile memory device 110.

The decoding block 122 may perform error correction decoding on the data "DATA" which the controller 120 receives from the nonvolatile memory device 110 in the read operation. By performing error correction decoding by using a parity of the data "DATA", the decoding block 122 may correct errors from the received data "DATA" and may remove the parity, thus recovering the original data.

Figure 2:
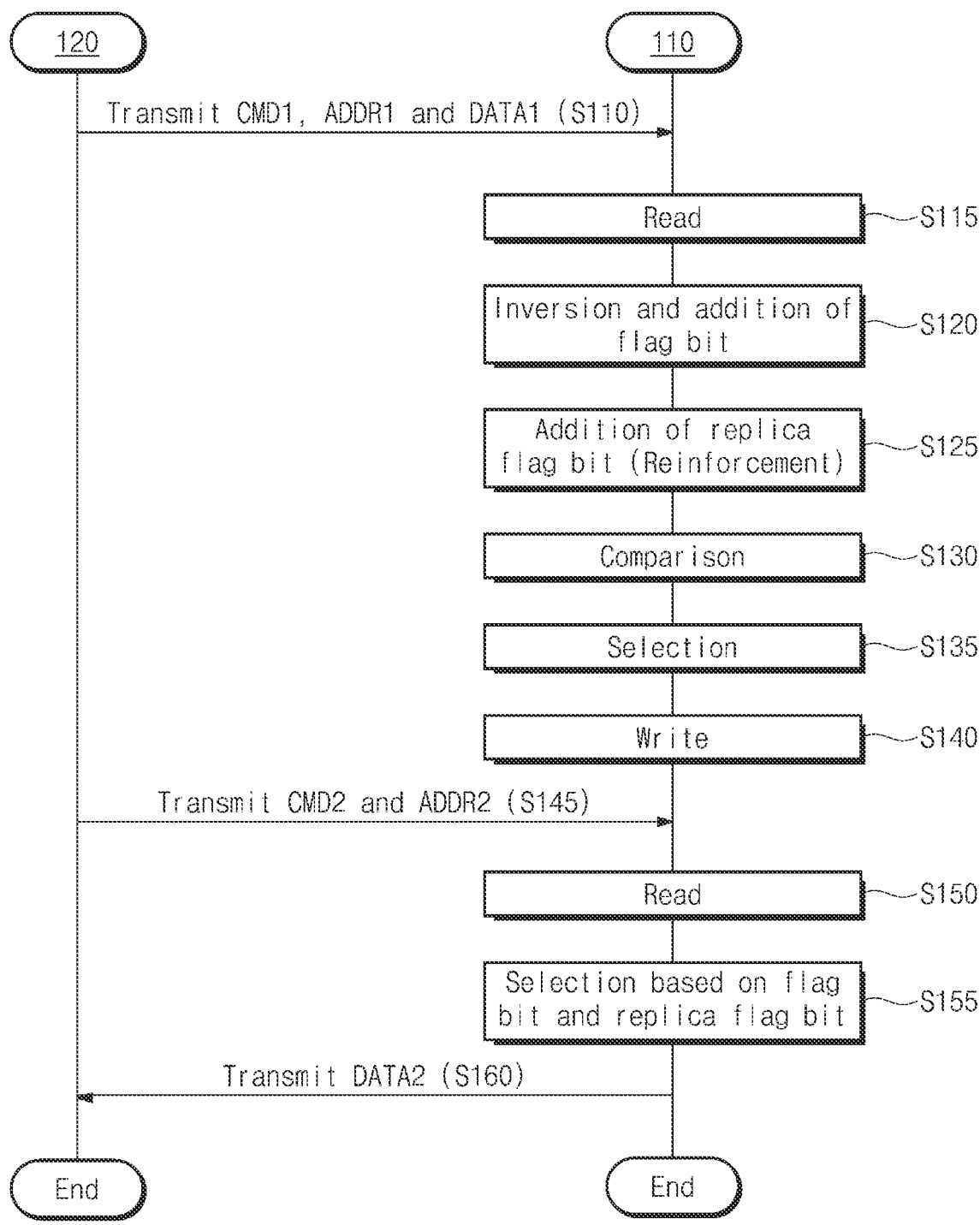
FIG. 2 is a flowchart associated with an operating method of a memory system of FIG. 1 according to an exemplary embodiment of the inventive concept.

FIG. 2 is a flowchart illustrating an operating method of the memory system 100 of FIG. 1 according to an exemplary embodiment of the inventive concept. Referring to FIGS. 1 and 2, in operation S110, the controller 120 transmits a first command CMD1, a first address ADDR1, and first data DATA1 to the nonvolatile memory device 110. For example, the first command CMD1 may be a write command. The first data DATA1 may be data to be written in the nonvolatile memory device 110.

In an exemplary embodiment, the nonvolatile memory device 110 performs the compare and write operation in response to the first command CMD1. The compare and write operation may be performed through operation S115 to operation S140.

In operation S115 of the compare and write operation, the nonvolatile memory device 110 reads data (e.g., existing data) stored in memory cells selected by the first address ADDR1, from among the memory cells of the memory cell block 111.

In operation S120 of the compare and write operation, the nonvolatile memory device 110 inverts the first data DATA1. Also, the nonvolatile memory device 110 adds flag bits to the first data DATA1 and the inverted data, respectively. A first flag bit (e.g., "1" or "0") indicating the non-inversion is added to the first data DATA1. A second flag bit (e.g., "0" or "1") indicating the inversion is added to the inverted data.

In operation S125 of the compare and write operation, the nonvolatile memory device 110 adds a replica flag bit. For example, the nonvolatile memory device 110 may add at least one first replica flag bit, which is identical to the first flag bit indicating non-inversion, to the first data DATA1. Also, the nonvolatile memory device 110 may add at least one second replica flag bit, which is identical to the second flag bit indicating the inversion, to the inverted data. The adding of the replica flag bits may be referred to as a reinforcement operation.

The addition of the replica flag bit may increase reliability of the flag bit, and may reinforce integrity of the first data DATA1 while writing and reading the first data DATA1 in the nonvolatile memory device 110.

In an exemplary embodiment, first candidate data is generated by adding the first flag bit and the at least one first replica flag bit to the first data DATA1. In the Second candidate data may be generated by adding the second flag bit and the at least one second replica flag bit to the inverted data.

In operation S130 of the compare and write operation, the nonvolatile memory device 110 compares the existing data with the first candidate data and the second candidate data. For example, the nonvolatile memory device 110 may calculate the number of positions at which the corresponding bits of the existing data and the first candidate data are different, that is, a first hamming distance. Also, the nonvolatile memory device 110 may calculate the number of positions at which the corresponding bits of the existing data and the second candidate data are different, that is, a second hamming distance.

In operation S135 of the compare and write operation, the nonvolatile memory device 110 selects one of the first candidate data and the second candidate data, based on a result of the comparison. In an exemplary embodiment, the nonvolatile memory device 110 selects candidate data having a smaller hamming distance with respect to the existing data. In operation S140 of the compare and write operation, the nonvolatile memory device 110 writes the selected candidate data in the memory cells selected by the first address ADDR1. In an exemplary embodiment, the writing of the selected candidate data includes entirely overwriting existing data within the memory cells selected by the first address ADDR1 with the selected candidate data. This first scheme may be a typical write operation. In another exemplary embodiment, the writing of the selected candidate data includes only overwriting bits of the existing data with different corresponding bits of the selected candidate data. For example, if the existing data is 8 bit data, and only the first bit of the existing data differs from the selected candidate data, then only the first bit of the existing data is written with the first bit of the candidate data. This second scheme may be the compare and write operation on which an exemplary embodiment focuses as shown in the comparison operation of the operation S130.

According to the compare and write operation, candidate data, which has a smaller difference (e.g., a smaller hamming distance) with the existing data, from among the first and second candidate data generated from the first data DATA1 is written in the nonvolatile memory device 110. Accordingly, the number of set operations or reset operations necessary for memory cells in which the existing data are stored may decrease, and thus, power consumption of the write operation is reduced. For example, a set operation may be used to overwrite a bit of the existing data with a 1 and a reset operation may be used to overwrite a bit of the existing data with a 0.

In operation S145, the controller 120 transmits a second command CMD2 and a second address ADDR2 to the nonvolatile memory device 110. For example, the second command CMD2 may be a read command.

The nonvolatile memory device 110 performs the read operation in response to the second command CMD2. The read operation may be performed through operation S150 to operation S160. In operation S150 of the read operation, the nonvolatile memory device 110 reads memory cells selected by the second address ADDR2.

In operation S155 of the read operation, the nonvolatile memory device 110 detects a flag bit and at least one replica flag bit from the read data. The nonvolatile memory device 110 selects one of the read data or inverted data of the read data, based on the flag bit and the at least one replica flag bit. For example, if the flag bit and the at least one replica flag bit indicate data of the read data is not inverted, the read data is selected. For example, if the flag bit and the at least one replica flag bit indicate data of the read data is inverted, the data of the read data is inverted to generate the inverted data, and the inverted data is selected.

In operation S160 of the read operation, the nonvolatile memory device 110 removes the flag bit and the at least one replica flag bit from the selected data and transmits resultant data to the controller 120 as second data DATA2.

As described above, the nonvolatile memory device 110 or the memory system 100 according to an embodiment of the inventive concept may reduce power consumption by performing the compare and write operation. Also, the memory system 100 or the nonvolatile memory device 110 according to an embodiment of the inventive concept may reinforce a flag bit and integrity of original data by adding a replica flag bit.

Figure 3:
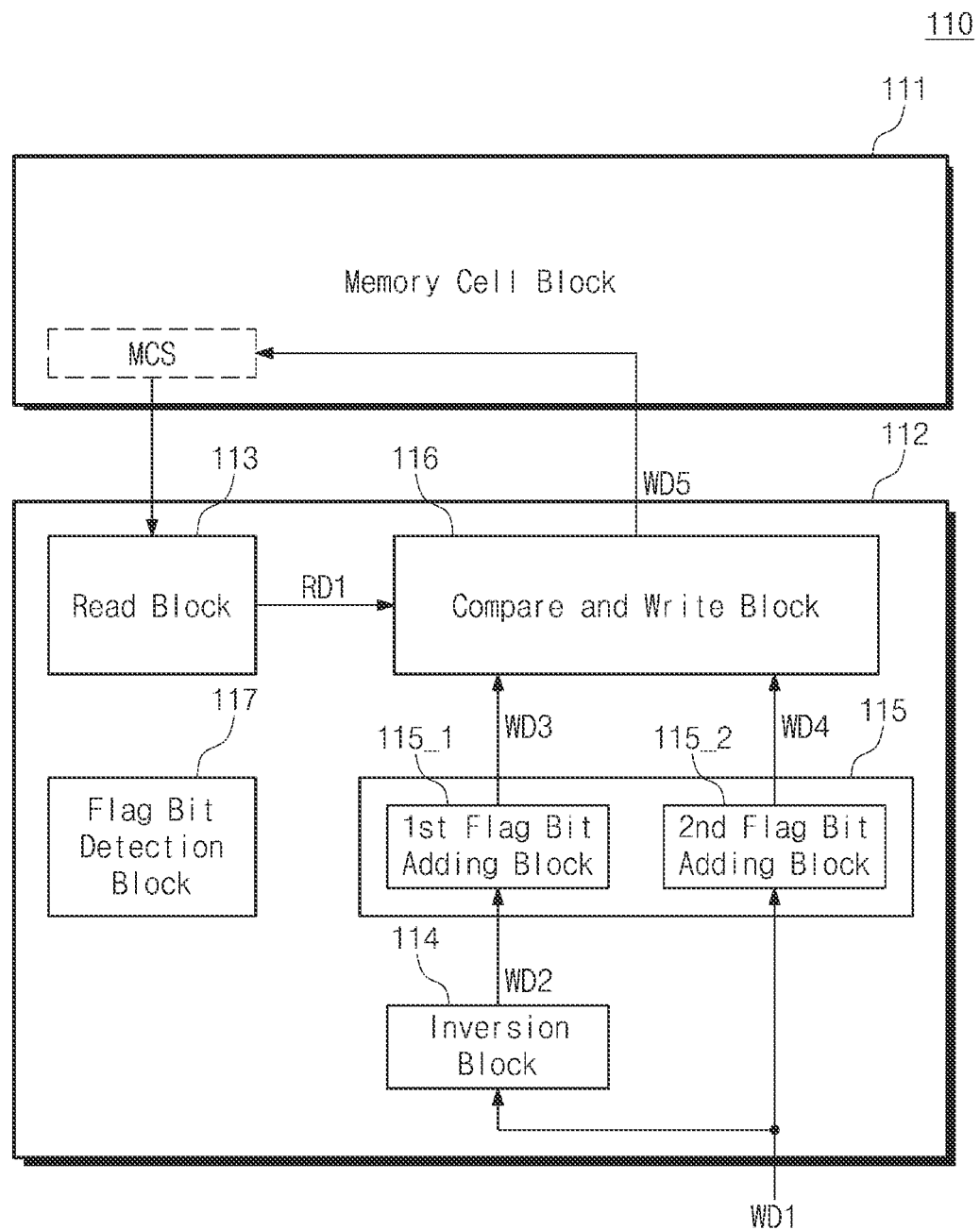
FIG. 3 illustrates an example in which a nonvolatile memory device of FIG. 1 performs a compare and write operation for writing first write data transmitted from a controller.

FIG. 3 shows an example in which the nonvolatile memory device 110 of FIG. 1 performs a compare and write operation for writing first write data WD1 transmitted from the controller 120. Referring to FIGS. 1 to 3, the first write data WD1 input to the nonvolatile memory device 110 corresponds to the first data DATA1 of operation S110 of FIG. 2.

In operation S115 of FIG. 2, the read block 113 reads first read data RD1 from selected memory cells MCS of the memory cell block 111. The first read data RD1 is provided to the compare and write block 116 without passing through the flag bit detection block 117.

In operation S120 and operation S125 of FIG. 2, the first write data WD1 is provided to the inversion block 114 and the flag bit adding block 115. The inversion block 114 inverts the first write data WD1 to generate second write data WD2. The second write data WD2 is provided to the flag bit adding block 115.

The flag bit adding block 115 includes a first flag bit adding block 115_1 and a second flag bit adding block 115_2. The first flag bit adding block 115_1 receives the second write data WD2 from the inversion block 114. The first flag bit adding block 115_1 adds flag bits to the second write data WD2 to generate third write data WD3.

For example, the first flag bit adding block 115_1 may add a flag bit (e.g., "1" or "0") indicating the inversion to the second write data WD2. Also, the first flag bit adding block 115_1 may further add at least one identical flag bit (e.g., a replica bit) to the second write data WD2. The third write data WD3 may include flag bits such as "111" or "000". Flag bits may be sequentially arranged in the third write data WD3 or may be distributed and arranged in the third write data WD3.

The second flag bit adding block 115_2 receives the first write data WD1. The second flag bit adding block 115_2 adds flag bits to the first write data WD1 to generate fourth write data WD4.

For example, the second flag bit adding block 115_2 adds a flag bit (e.g., "0" or "1") indicating original data (i.e., not inverted) to the first write data WD1. Also, the second flag bit adding block 115_2 may further add at least one identical flag bit (e.g., a replica bit) to the first write data WD1. The fourth write data WD4 may include flag bits such as "000" or "111". Flag bits may be sequentially arranged in the fourth write data WD4 or may be distributed and arranged in the fourth write data WD4. In an exemplary embodiment, the nonvolatile memory device 110 stores locations of the flag bits so that the flag detection block 117 knows which bits of the read data to interpret as the flag bits. In another exemplary embodiment, the nonvolatile memory device 110 places the flag bits into fixed(or given) location so that the flag detection block 117 knows which bits of the read data to interpret as the flag bits.

The flag bit adding block 115 generates the third write data WD3 and the fourth write data WD4. The third write data WD3 and the fourth write data WD4 may be candidate data capable of being written in the memory cell block 111. The third write data WD3 and the fourth write data WD4 are provided to the compare and write block 116.

In operation S130 of FIG. 2, the compare and write block 116 compares the first read data RD1 and the third write data WD3. Each of the third write data WD3 and the first read data RD1 includes a sequence of bits. In the case where a bit of the third write data WD3 and a bit of the first read data RD1 are identical at a specific position on the sequence of bits, a set operation or a reset operation of a memory cell corresponding to the specific position upon writing the third write data WD3 is unnecessary.

In the case where a bit of the third write data WD3 and a bit of the first read data RD1 are different at a specific position on the sequence of bits, a set operation or a reset operation of a memory cell corresponding to the specific position upon writing the third write data WD3 is necessary.

The memory system 100 or the nonvolatile memory device 110 may reduce the number of memory cells requiring the set operation or the reset operation, thus reducing power consumption in the write operation. The compare and write block 116 may detect the number of positions requiring the set operation or the reset operation between the first read data RD1 and the third write data WD3 as a first difference (e.g., a first hamming distance).

Likewise, the compare and write block 116 may compare the first read data RD1 and the fourth write data WD4. The compare and write block 116 may detect the number of positions requiring the set operation or the reset operation between the first read data RD1 and the fourth write data WD4 as a second difference (e.g., a second hamming distance).

In operation S135 of FIG. 2, based on the first difference and the second difference, the compare and write block 116 selects write data, which has a smaller difference with respect to the first read data RD1, from among the third and fourth write data WD3 and WD4 as fifth write data WD5.

In operation S140 of FIG. 2, the compare and write block 116 writes the fifth write data WD5 in the selected memory cells MCS. In an exemplary embodiment, the writing of the fifth data WD5 includes only writing bits of the fifth data WD5 in the selected memory cells MCS that differ from corresponding bits of the first read data RD1. Accordingly, power consumption is reduced upon writing data in the selected memory cells MCS.

Figure 4:
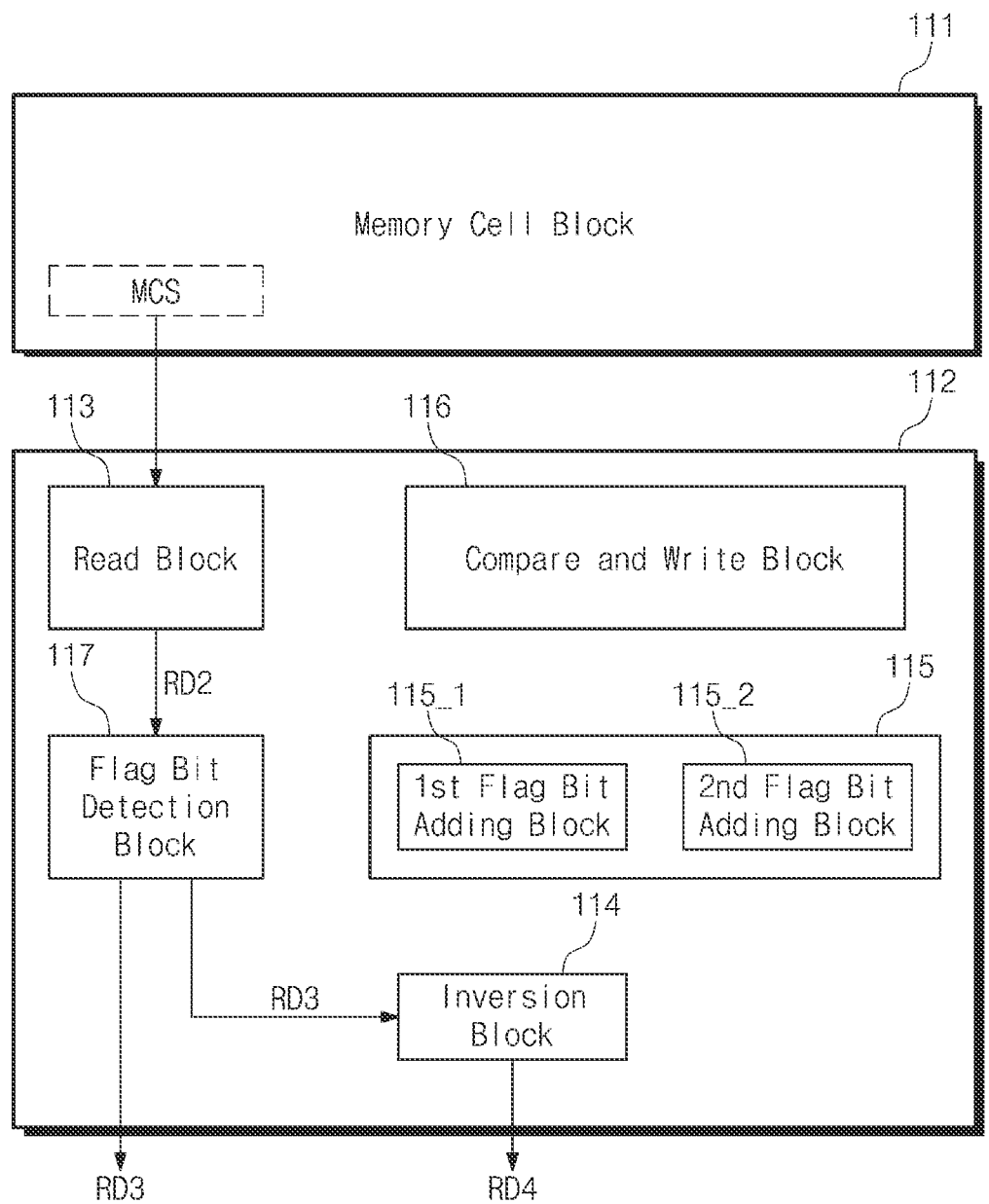
FIG. 4 illustrates an example in which a nonvolatile memory device performs a read operation for reading data, according to an exemplary embodiment of the inventive concept.

FIG. 4 illustrates an example in which the nonvolatile memory device 110 performs a read operation for reading data, according to an exemplary embodiment of the inventive concept. Referring to FIGS. 1, 2, and 4, in operation S150 of FIG. 2, the read block 113 reads second read data RD2 from the selected memory cells MCS. The second read data RD2 is provided to the flag bit detection block 117.

In operation S155 and operation S160 of FIG. 2, the flag bit detection block 117 detects a flag bit and at least one replica flag bit from the second read data RD2. Below, a flag bit and at least replica flag bit of data read in the read operation may be collectively referred to as "flag bits".

The flag bit detection block 117 removes the flag bits from the second read data RD2 to generate third read data RD3. Depending on the flag bits, the flag bit detection block 117 outputs the third read data RD3 without modification or provides the third read data RD3 to the inversion block 114. For example, if the flag bits indication inversion, the flag bit detection block 117 outputs the third read data RD3 to the inversion block 114 and otherwise outputs the third read data RD3 without modification.

For example, the flag bit detection block 117 may perform voting based on the flag bits. When the number of flag bits indicating original data (i.e., not inverted) is more than the number of flag bits indicating inversion, the nonvolatile memory device 110 outputs the third read data RD3 without modification.

When the number of flag bits indicating original data is less than the number of flag bits indicating inversion, the flag bit detection block 117 provides the third read data RD3 to the inversion block 114. The inversion block 114 inverts the third read data RD3 to generate fourth read data RD4. The nonvolatile memory device 110 may select and output the fourth read data RD4 as a result of the read operation.

In another example, the flag bit detection block 117 performs a unanimous determination based on the flag bits. When all flag bits indicate original data, the nonvolatile memory device 110 selects and outputs the third read data RD3.

When all flag bits indicate inversion, the flag bit detection block 117 provides the third read data RD3 to the inversion block 114. The nonvolatile memory device 110 may select and output the fourth read data RD4 output from the inversion block 114.

In an exemplary embodiment, when some flag bits indicate the original and the others indicate the inversion, the flag bit detection block 117 provides the third read data RD3 to the inversion block 114. The nonvolatile memory device 110 may select both the third read data RD3 and the fourth read data RD4 and may sequentially output the third read data RD3 and the fourth read data RD4.

As a result, one of the third read data RD3 and the fourth read data RD4 may be output according to the flag bits, and may correspond to the second data DATA2 in FIG. 2. As described above, the memory system 100 according to an embodiment of the inventive concept may reinforce integrity of data read from the memory cell block 111 by adding replica bits to a flag bit.

In FIGS. 1 to 4, a description is given assuming the encoding block 121 and the decoding block 122 are located within the controller 120. However, the encoding block 121 and the decoding block 122 may instead be located within the nonvolatile memory device 110.

Figure 5:
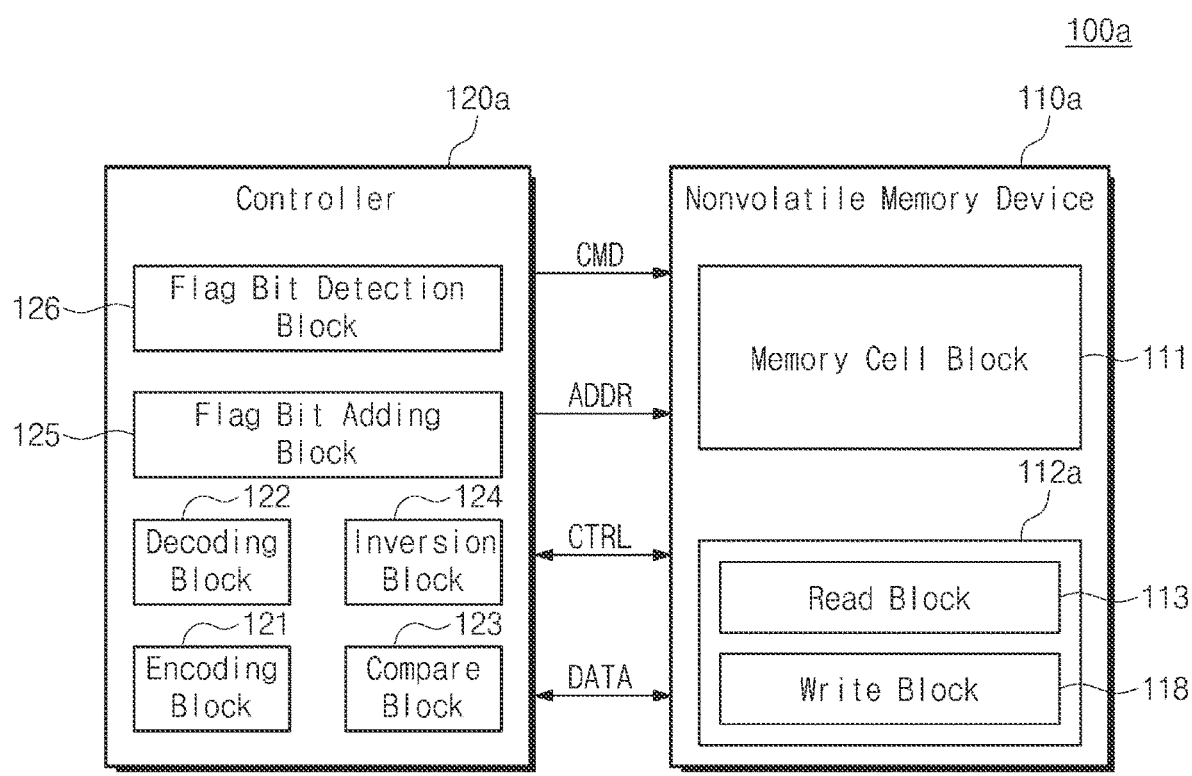
FIG. 5 is a block diagram illustrating a memory system according to an exemplary embodiment of the inventive concept.

FIG. 5 is a block diagram illustrating a memory system 100a according to an exemplary embodiment of the inventive concept. Referring to FIG. 5, the memory system 100a includes a nonvolatile memory device 110a and a controller 120a.

As described with reference to FIGS. 1 to 4, the nonvolatile memory device 110a may exchange the command CMD, the address ADDR, the control signals CTRL, and the data "DATA" with the controller 120a. The nonvolatile memory device 110a includes the memory cell block 111 and a peripheral block 112a. A configuration and an operation of the memory cell block 111 may be identical to those described with reference to FIGS. 1 to 4.

The peripheral block 112a includes the read block 113 and a write block 118. As described with reference to FIGS. 1 to 4, the read block 113 performs a read operation for reading data from selected memory cells of the memory cell block 111. The read block 113 provides the read data to the controller 120a as the data "DATA".

The write block 118 performs the write operation for writing the data "DATA" transmitted from the controller 120a in the selected memory cells of the memory cell block 111. Unlike the description given with reference to FIGS. 1 to 4, the nonvolatile memory device 110a does not perform the compare and write operation in response to a write command and performs only the write operation in response to the write command. In this embodiment, the compare and write operation are instead performed by the controller 120a.

The controller 120a may exchange the command CMD, the address ADDR, the control signals CTRL, and the data "DATA" with the nonvolatile memory device 110a. The controller 120a may enable the nonvolatile memory device 110a to perform the write operation or the read operation. As in the description given with reference to FIGS. 1 to 4, the controller 120a may perform the compare and write operation on the nonvolatile memory device 110a. The controller 120a may reduce power consumption in the write operation by performing the compare and write operation.

The controller 120a includes the encoding block 121, the decoding block 122, a compare block 123, an inversion block 124, a flag bit adding block 125, and a flag bit detection block 126.

The encoding block 121 may perform error correction encoding on first data. For example, the encoding block 121 may add a parity for error correction to original data (or input data) to generate second data.

The decoding block 122 may perform error correction decoding on the second data in which an error may be present. For example, the decoding block 122 may correct an error (or errors) existing in the second data, may remove a parity, and may recover the first data. For example, the decoding block 122 may correct an error in a portion of the second data using the parity to generate corrected data and remove the parity from the corrected data to recover the first data.

The encoding block 121 and the decoding block 122 may be paired. The encoding block 121 and the decoding block 122 may respectively perform encoding and decoding based on the same error correction algorithm.

Similar to the compare and write block 116 described with reference to FIGS. 1 to 4, the compare block 123 may compare pieces of candidate data with existing data. The compare block 123 may select candidate data, which further reduces power consumption of the write operation, from among the pieces of candidate data based on a result of the comparison.

The inversion block 124 may invert data to be written in the nonvolatile memory device 110a. For example, the inversion block 124 may invert corresponding data in one of various phases, in which data to be written in the nonvolatile memory device 110a are processed, within the controller 120a. Two or more candidate data to be written in the nonvolatile memory device 110a may be generated by the inversion block 124.

Similar to the flag bit adding block 115 described with reference to FIGS. 1 to 4, the flag bit adding block 125 may add a flag bit and at least one replica flag bit to each of data inverted by the inversion block 124 and data not inverted by the inversion block 124. For example, the flag bit adding block 125 may add flag bits in one of various phases, in which data to be written in the nonvolatile memory device 110a are processed, within the controller 120a.

Similar to the flag bit detection block 117 described with reference to FIGS. 1 to 4, the flag bit detection block 126 may detect flag bits from the data "DATA" transmitted from the nonvolatile memory device 110a. For example, the flag bit detection block 126 may detect flag bits in one of various phases, in which data received from the nonvolatile memory device 110a are processed, within the controller 120a.

In an embodiment, an order and a method in which the encoding block 121, the decoding block 122, the compare block 123, the inversion block 124, the flag bit adding block 125, and the flag bit detection block 126 provided within the controller 120a process the data "DATA" to be transmitted to the nonvolatile memory device 110a or the data "DATA" received from the nonvolatile memory device 110a may be variously organized and may be variously modified.

Figure 6:
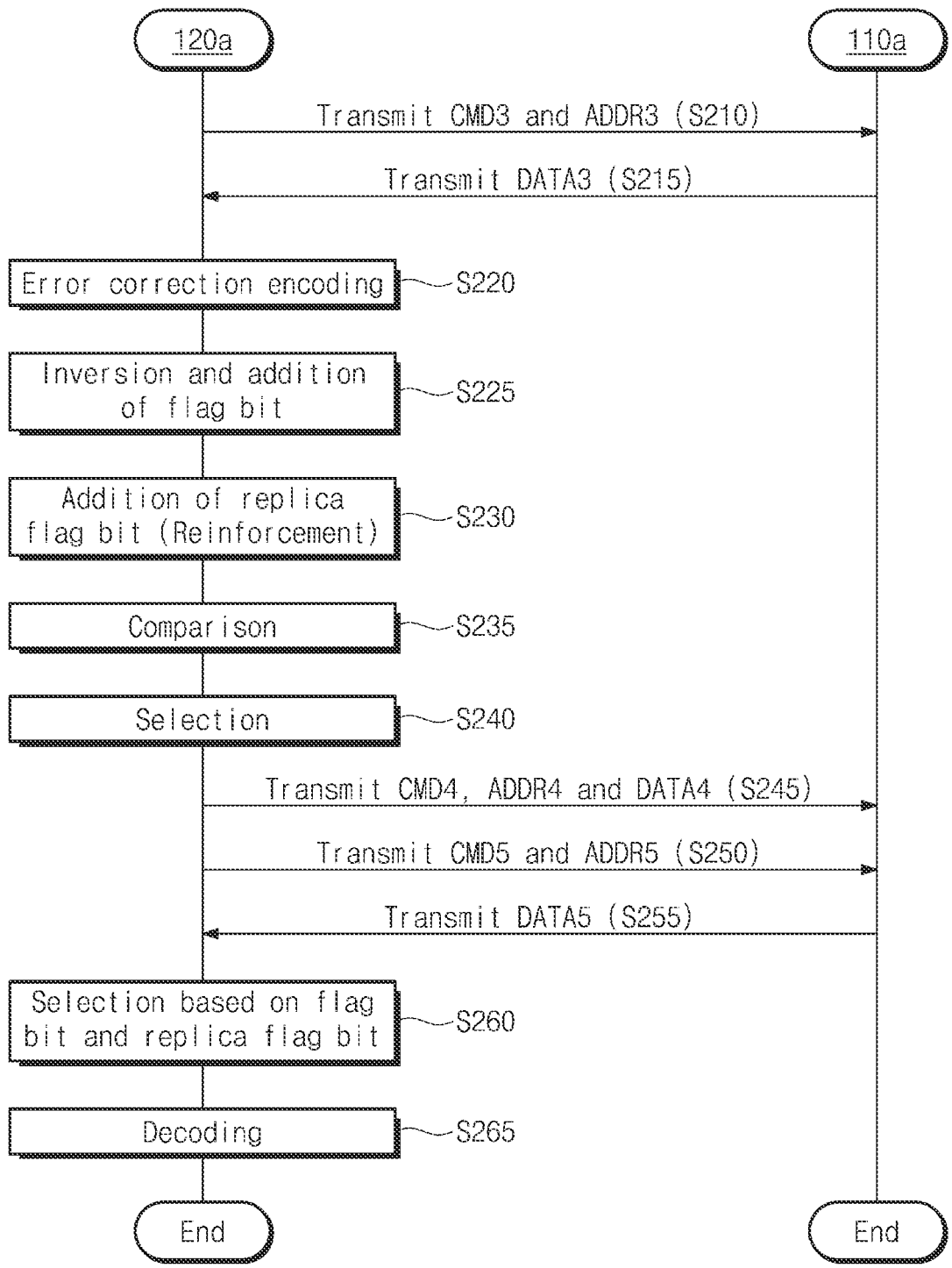
FIG. 6 is a flowchart illustrating an operating method of a memory system of FIG. 5 according to an exemplary embodiment of the inventive concept.

FIG. 6 is a flowchart illustrating an operating method of the memory system 100a of FIG. 5 according to an exemplary embodiment of the inventive concept. Referring to FIGS. 5 and 6, upon writing data in the nonvolatile memory device 110a, the controller 120a performs the compare and write operation. The compare and write operation may be performed through operation S210 to operation S245.

In operation S210 of the compare and write operation, the controller 120a transmits a third command CMD3 and a third address ADDR3 to the nonvolatile memory device 110a. The third command CMD3 may be a read command and may be transmitted for comparison. The third address ADDR3 may indicate memory cells (e.g., selected memory cells), in which data will be written, from among memory cells of the nonvolatile memory device 110a.

In operation S215 of the compare and write operation, the nonvolatile memory device 110a performs the read operation in response to the third command CMD3 and the third address ADDR3 and transmits third data DATA3 read through the read operation.

In operation S220 of the compare and write operation, the controller 120a performs error correction encoding on original data to be written in the nonvolatile memory device 110a. In operation S225 of the compare and write operation, the controller 120a may convert the encoded data.

The converting of the encoded data may include the controller 120a adding flag bits to the encoded data and the inverted data, respectively. A first flag bit (e.g., "1" or "0") indicating the non-inversion is added to the encoded data. A second flag bit (e.g., "0" or "1") indicating the inversion is added to the inverted data. For example, the encoded data may be inverted to generate the inverted data.

In operation S230 of the compare and write operation, the controller 120a adds a replica flag bit. As described with reference to operation S125 of FIG. 2, the controller 120a may generate first and second candidate data by adding replica flag bits to the encoded data and the inverted data, respectively.

In operation S235 of the compare and write operation, the controller 120a compares the third data DATA3 read from the nonvolatile memory device 110a, that is, existing data with the first candidate data and the second candidate data. For example, like operation S130 of FIG. 2, the controller 120a may calculate first and second hamming distances between the third data DATA3 and the first and second candidate data.

In operation S240 of the compare and write operation, the controller 120a selects one of the first candidate data and the second candidate data, based on a result of the comparison. In an exemplary embodiment, the controller 120a selects candidate data having a smaller hamming distance with respect to the existing data.

In operation S245 of the compare and write operation, the controller 120a transmits a fourth command CMD4, a fourth address ADDR4, and the selected candidate data as fourth data DATA4 to the nonvolatile memory device 110a.

The fourth command CMD4 may be a write command. Like the third address ADDR3, the fourth address ADDR4 may indicate the same selected memory cells of the nonvolatile memory device 110a. In response to the fourth command CMD4 and the fourth address ADDR4, the nonvolatile memory device 110a writes the fourth data DATA4 in the selected memory cells.

Upon reading data from the nonvolatile memory device 110a, the controller 120a may perform the read operation. The read operation may be performed through operation S250 to operation S265.

In operation S250 of the read operation, the controller 120 transmits a fifth command CMD5 and a fifth address ADDR5 to the nonvolatile memory device 110. For example, the fifth command CMD5 may be a read command. The fifth address ADDR5 may indicate selected memory cells in the nonvolatile memory device 110a. The fifth address ADDR5 may be identical to or different from the third address ADDR3 and the fourth address ADDR4.

In operation S255 of the read operation, in response to the fifth command CMD5 and the fifth address ADDR5, the nonvolatile memory device 110a reads data from the selected memory cells and transmits the read data to the controller 120a as fifth data DATA5.

In operation S260 of the read operation, the controller 120a detects a flag bit and at least one replica flag bit from the fifth data DATA5. The controller 120a selects one of fifth data DATA5 or inverted data of the fifth data DATA5, based on the flag bit and the at least one replica flag bit.

In operation S265 of the read operation, the controller 120a performs a decoding on the selected data. The decoding may remove the flag bit and the at least one replica flag bit from the selected data to generate a result and then perform error correction decoding on the result to generate decoded data. The controller 120a may obtain the decoded data as a result of the read operation.

Figure 7:
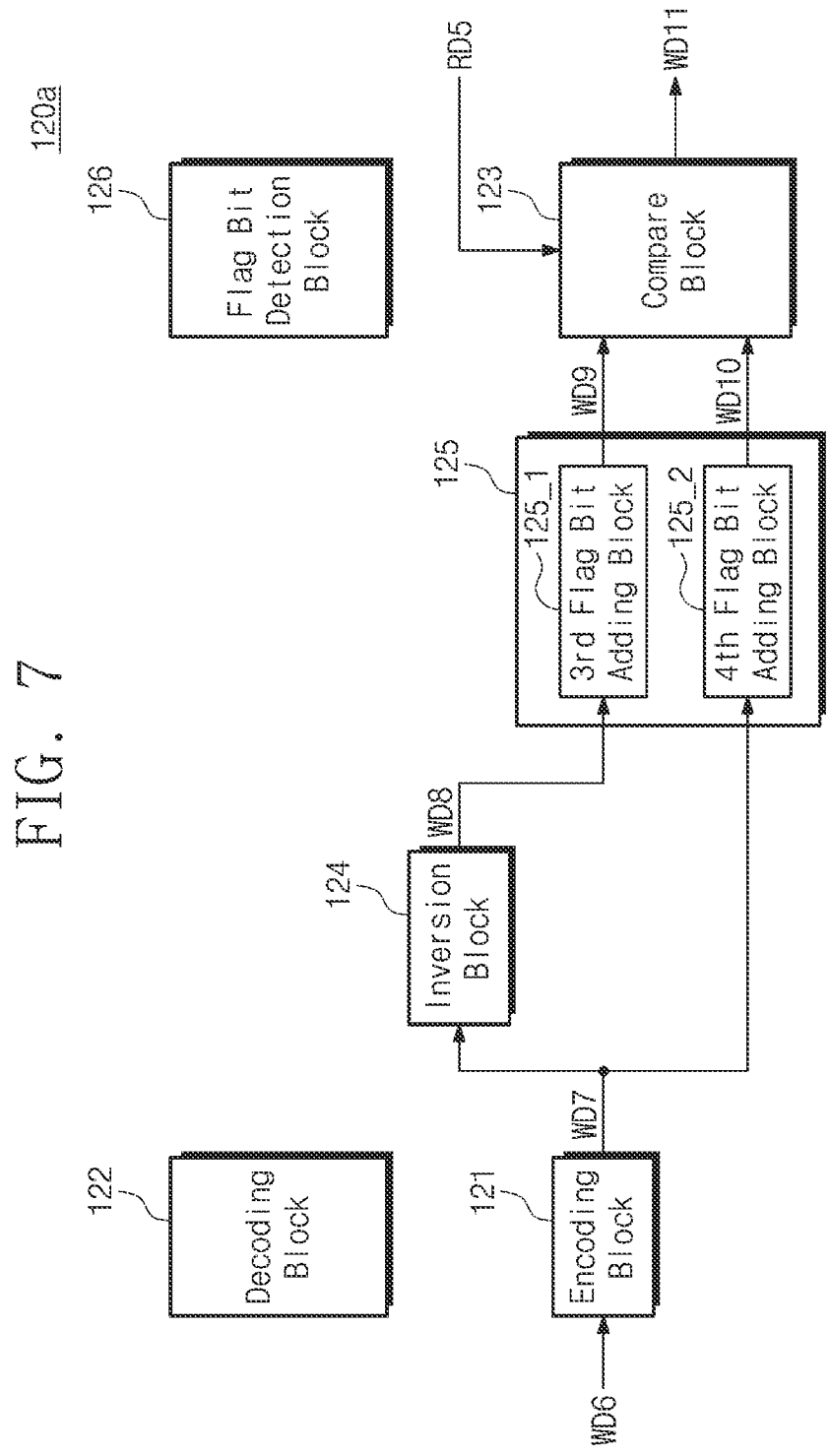
FIG. 7 illustrates an example in which a controller of FIG. 5 performs a compare and write operation for writing data in a nonvolatile memory device.

FIG. 7 illustrates an example in which the controller 120a of FIG. 5 performs a compare and write operation for writing data in the nonvolatile memory device 110a. Referring to FIGS. 5 to 7, as described with reference to operation S210 and operation S215 of FIG. 6, the controller 120a receives fifth read data RD5 as the third data DATA3 from the nonvolatile memory device 110a. The fifth read data RD5 is provided to the compare block 123. In an exemplary embodiment, the compare block 123 is implemented by one or more comparators or comparator circuits.

As described with reference to operation S220 of FIG. 6, the encoding block 121 performs error correction encoding on sixth write data WD6 to generate seventh write data WD7. The seventh write data WD7 may include the sixth write data WD6 and a parity for error correction.

As described with reference to operation S225 and operation S230 of FIG. 6, the inversion block 124 inverts the seventh write data WD7 to generate eighth write data WD8. The flag bit adding block 125 includes a first flag bit adding block 125_1 and a second flag bit adding block 125_2.

The first flag bit adding block 125_1 adds a flag bit indicating the inversion and at least one identical replica flag bit to the eighth write data WD8 to generate ninth write data WD9. The second flag bit adding block 125_2 adds a flag bit indicating the non-inversion and at least one identical replica flag bit to the seventh write data WD7 to generate tenth write data WD10.

The ninth write data WD9 and the tenth write data WD10 may correspond to the first candidate data and the second candidate data described in operation S230, respectively. As described with reference to operation S235 of FIG. 6, the compare block 123 compares the fifth read data RD5 with the ninth write data WD9 and the tenth write data WD10. For example, the compare block 123 may calculate hamming distances between the fifth read data RD5 and the ninth write data WD9 and between the fifth read data RD5 and the tenth write data WD10.

As described with reference to operation S240 of FIG. 6, the compare block 123 selects one of the ninth and tenth write data WD9 and WD10, based on a third difference between the fifth read data RD5 and the ninth write data WD9 and a fourth difference between the fifth read data RD5 and the tenth write data WD10.

As described with reference to operation S245 of FIG. 6, the data selected by the compare block 123 is eleventh write data WD11. The controller 120a may transmit the eleventh write data WD11 as the fourth data DATA4 to the nonvolatile memory device 110a.

Figure 8:
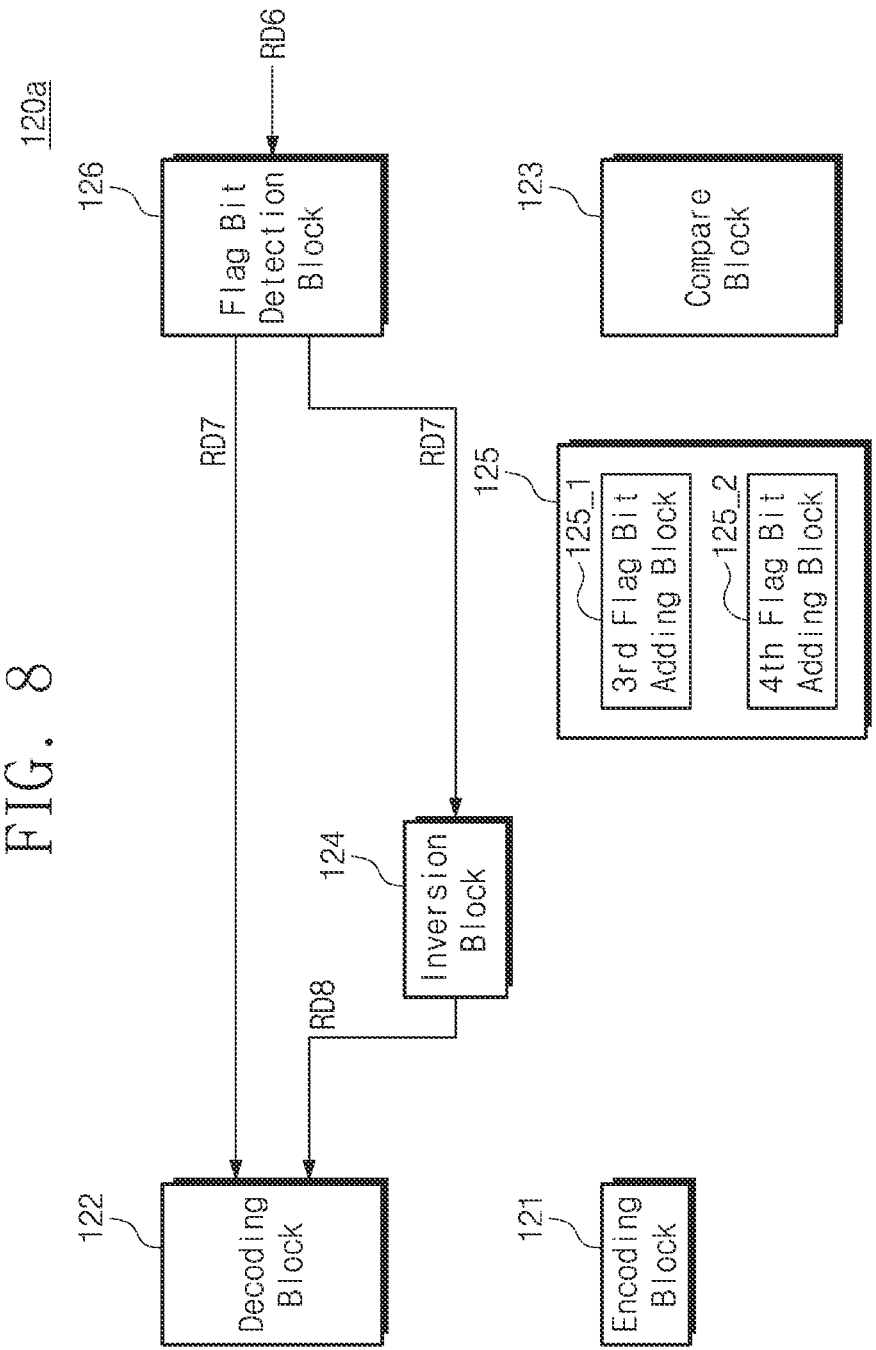
FIG. 8 illustrates an example in which a controller of FIG. 5 performs a read operation for reading data from a nonvolatile memory device.

FIG. 8 illustrates an example in which the controller 120a of FIG. 5 performs a read operation for reading data from the nonvolatile memory device 110a. Referring to FIGS. 5, 6, and 8, as described with reference to operation S250 and operation S255 of FIG. 6, the controller 120a receives sixth read data RD6 as the fifth data DATA5 from the nonvolatile memory device 110a. The sixth read data RD6 is provided to the flag bit detection block 126.

As described with reference to operation S260 and operation S265 of FIG. 6, the flag bit detection block 126 may detect a flag bit and at least one replica flag bit (i.e., flag bits) from the sixth read data RD6. The flag bit detection block 126 may detect the flag bits from the sixth read data RD6 to generate seventh read data RD7.

Depending on the flag bits, the flag bit detection block 126 may provide the seventh read data RD7 to the decoding block 122 or to the inversion block 124. For example, the flag bit detection block 126 may perform voting based on the flag bits. The flag bit detection block 126 may provide the seventh read data RD7 to the decoding block 122 or to the inversion block 124, based on a dominant state, which the flag bits indicate, for example, a non-inversion state or an inversion state. For example, if most of the flag bits indicate inversion, the dominant state could be referred to as an inversion state, and the flag bit detection block 126 provides the seventh read data RD7 to the inversion block 124. For example, if most of the flag bits indicate non-inverted data, the dominant state could be referred to as a non-inversion state, and the flag bit detection block 126 provides the seventh read data RD7 directly to the decoding block 122.

In another example, the flag bit detection block 126 performs a unanimous determination. The flag bit detection block 126 provides the seventh read data RD7 to the decoding block 122 or to the inversion block 124, based on a state, which all the flag bits identically indicate, for example, the non-inversion state or the inversion state. When the seventh read data RD7 are transmitted from the flag bit detection block 126, the inversion block 124 may invert the seventh read data RD7 to generate eighth read data RD8.

The decoding block 122 may perform error correction decoding on the seventh read data RD7 transmitted from the flag bit detection block 126 (e.g., when the non-inversion state is determined), or may perform error correction decoding on the eighth read data RD8 transmitted from the inversion block 124 (e.g., when the inversion state is determined).

In another example, when some flag bits indicate the original and the others indicate the inversion, the flag bit detection block 126 may provide the seventh read data RD7 both to the decoding block 122 and to the inversion block 124. The decoding block 122 may perform error correction decoding on the seventh read data RD7 and the eighth read data RD8 sequentially or simultaneously.

When the decoding block 122 is configured to perform error correction decoding on the seventh read data RD7 and the eighth read data RD8 simultaneously, the decoding block 122 may include at least two sub-blocks which may perform error correction decoding independently of each other.

As described with reference to FIGS. 1 to 8, the nonvolatile memory device 110a or the controller 120a according to an embodiment of the inventive concept performs the compare and write operation. The nonvolatile memory device 110a or the controller 120a may write two or more flag bits indicating a non-inversion state (or an original state) or an inversion state. Accordingly, power consumption is reduced upon writing data, and integrity of data is reinforced.

Figure 9:
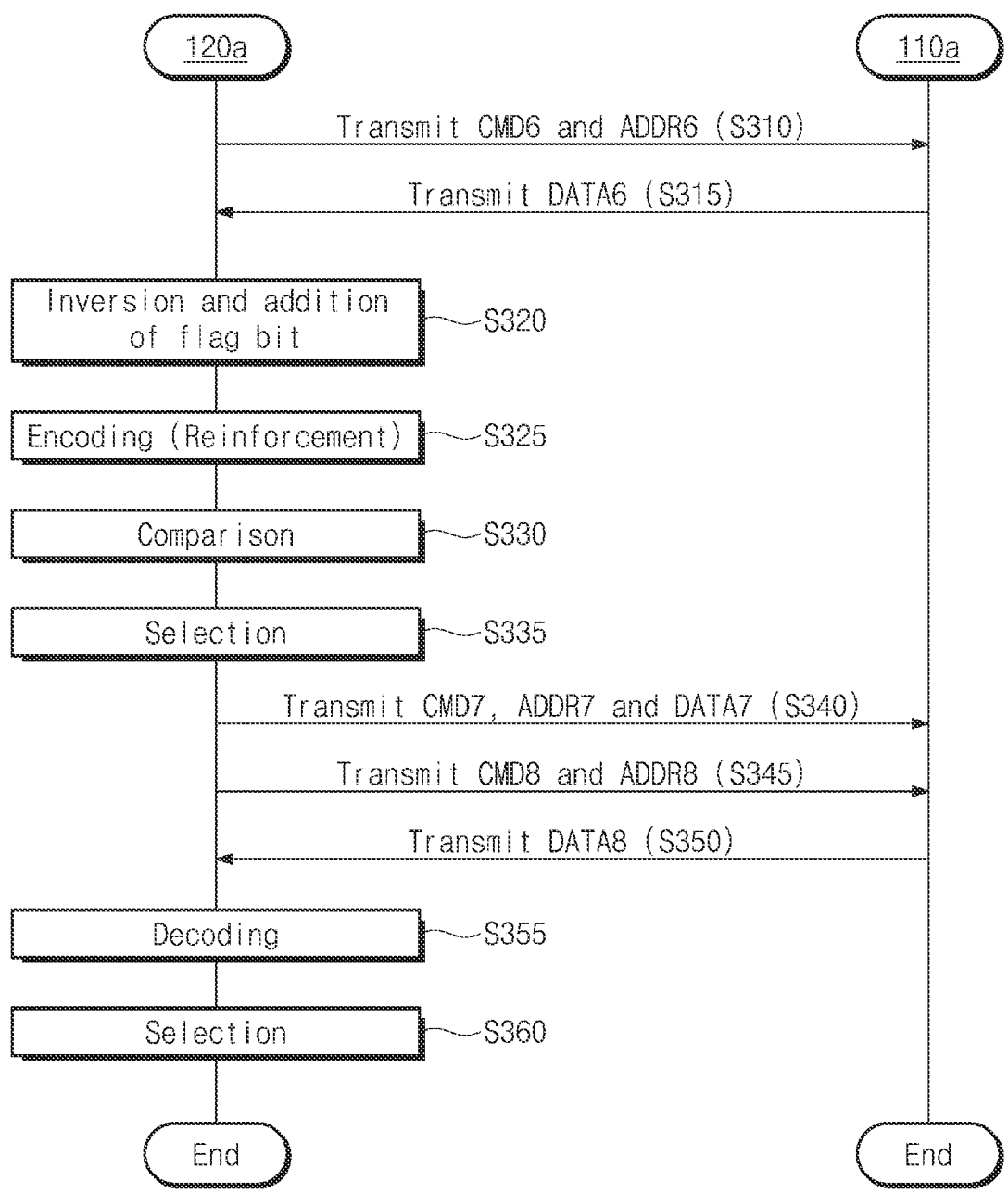
FIG. 9 is a flowchart illustrating another example of an operating method of a memory system of FIG. 5.

FIG. 9 is a flowchart illustrating another example of an operating method of the memory system 100a of FIG. 5 according to an exemplary embodiment of the inventive concept. Referring to FIGS. 5 and 9, upon writing data in the nonvolatile memory device 110a, the controller 120a performs the compare and write operation. The compare and write operation may be performed through operation S310 to operation S335.

In operation S310 of the compare and write operation, the controller 120a transmits a sixth command CMD6 and a sixth address ADDR6 to the nonvolatile memory device 110a. The sixth command CMD6 may be a read command and may be transmitted for comparison. In operation S315 of the compare and write operation, the nonvolatile memory device 110 performs a read operation in response to the sixth command CMD6 and the sixth address ADDR6 to retrieve sixth data DATA6 and transmits the sixth data DATA6 to the controller 120a.

In operation S320 of the compare and write operation, the controller 120a inverts original data to be written in the nonvolatile memory device 110a. The controller 120a adds a first flag bit indicating the non-inversion to the original data and adds a second flag bit indicating the inversion to the inverted data. As described with reference to FIGS. 5 to 8, the controller 120a further adds replica flag bits to the original data and the inverted data, respectively.

In operation S325 of the compare and write operation, the controller 120a performs error correction encoding on the original data and the first flag bit to generate first candidate data. The controller 120a performs error correction encoding on the inverted data and the second flag bit to generate second candidate data.

In operation S330 of the compare and write operation, the controller 120a compares the sixth data DATA6 with the first candidate data and the second candidate data to calculate hamming distances. In operation S335 of the compare and write operation, the controller 120a selects the candidate data having a smaller hamming distance, based on a result of the comparison. Operation S325 and operation S330 may be identical to operation S235 and operation S240 of FIG. 6.

In operation S340, the controller 120a transmits a seventh command CMD7, a seventh address ADDR7, and seventh data DATA7 to the nonvolatile memory device 110a. The seventh command CMD7 may be a write command. The seventh address ADDR7 may indicate selected memory cells. In an embodiment, the seventh data DATA7 is the selected candidate data. The nonvolatile memory device 110a writes the seventh data DATA7 in the selected memory cells.

A read operation may be performed through operation S345 to operation S360. In operation S345 of the read operation, the controller 120a transmits an eighth command CMD8 and an eighth address ADDR8 to the nonvolatile memory device 110a. The eighth command CMD8 may be a read command.

In operation S350 of the read operation, the nonvolatile memory device 110a transmits eighth data DATA8 read from memory cells selected by the eighth address ADDR8 to the controller 120a.

In operation S355 of the read operation, the controller 120a performs error correction decoding on the eighth data DATA8 to generate decoded data. In operation S360 of the read operation, the controller 120a may obtain original data by detecting a flag bit from the decoded data, removing the flag bit from the decoded data based on the flag bit, and inverting the flag bit-removed data. The flag bit-removed data may be inverted when the flag bit indicates inversion was performed. If the flag bit indicates inversion was not performed, the inverting can be skipped.

As described with reference to operation S320 and operation S325, the controller 120a according to an embodiment of the inventive concept may add a flag bit and may then perform error correction encoding. Accordingly, the flag bit may be robust to an error, and integrity of data is reinforced.

Figure 10:
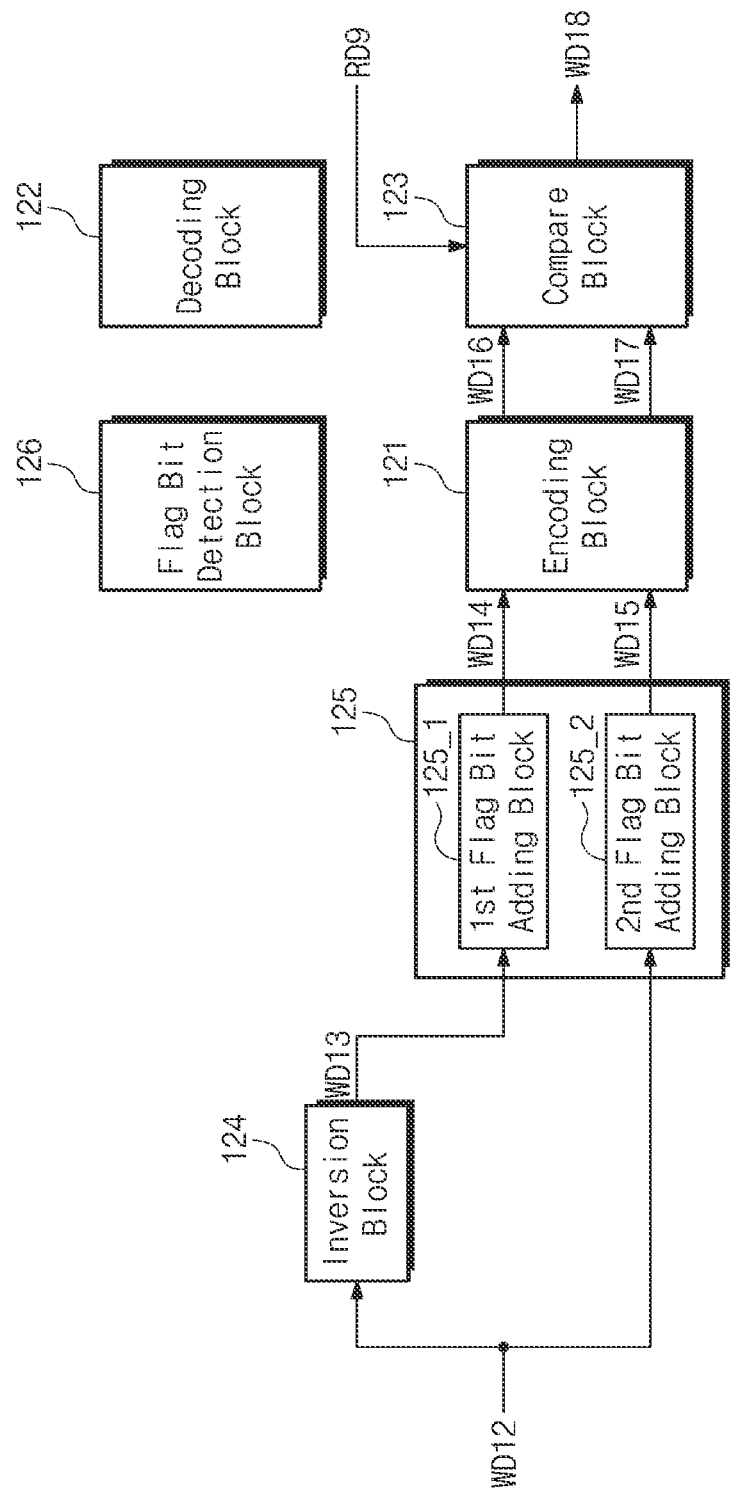
FIG. 10 illustrates an example in which a controller of FIG. 5 performs a compare and write operation for writing data in a nonvolatile memory device.

FIG. 10 illustrates an example in which the controller 120a of FIG. 5 performs a compare and write operation for writing data in the nonvolatile memory device 110a. Referring to FIGS. 5, 9, and 10, as described with reference to operation S310 and operation S315 of FIG. 9, the controller 120a receives ninth read data RD9 as sixth data DATA6 from the nonvolatile memory device 110a. The ninth read data RD9 is provided to the compare block 123 without passing through the decoding block 122.

As described with reference to operation S320 of FIG. 9, the inversion block 124 inverts twelfth write data WD12 to generate thirteenth write data WD13. The twelfth write data WD12 is original data to be written in the nonvolatile memory device 110a. The twelfth write data WD12 and the thirteenth write data WD13 are provided to the flag bit adding block 125.

The first flag bit adding block 125_1 adds a flag bit to the thirteenth write data WD13 to generate fourteenth write data WD14. The second flag bit adding block 125_2 adds a flag bit to the twelfth write data WD12 to generate fifteenth write data WD15. As described with reference to FIG. 7, a replica flag bit may be further added.

As described with reference to operation S325 of FIG. 9, the encoding block 121 performs error correction encoding on the fourteenth write data WD14 to generate sixteenth write data WD16. The encoding block 121 performs error correction encoding on the fifteenth write data WD15 to generate seventeenth write data WD17. The sixteenth write data WD16 and the seventeenth write data WD17 may be the first candidate data and the second candidate data mentioned in operation S325 of FIG. 9.

The encoding block 121 may perform encoding on the fourteenth write data WD14 and the fifteenth write data WD15 sequentially or in parallel. When the encoding block 121 is configured to perform parallel encoding, the encoding block 121 may include two or more sub-blocks which perform encoding independently of each other.

As described with reference to operation S330 and operation S335 of FIG. 9, the compare block 123 compares the ninth read data RD9 with the sixteenth and seventeenth write data WD16 and WD17. In an embodiment, the compare block 123 selects write data, which has a smaller difference with respect to the sixth read data RD6, from among the sixteenth and seventeenth write data WD16 and WD17 as eighteenth write data WD18.

As described with reference to operation S340 of FIG. 9, the controller 120a may transmit the eighteenth write data WD18 as seventh data DATA7 to the nonvolatile memory device 110a.

Figure 11:
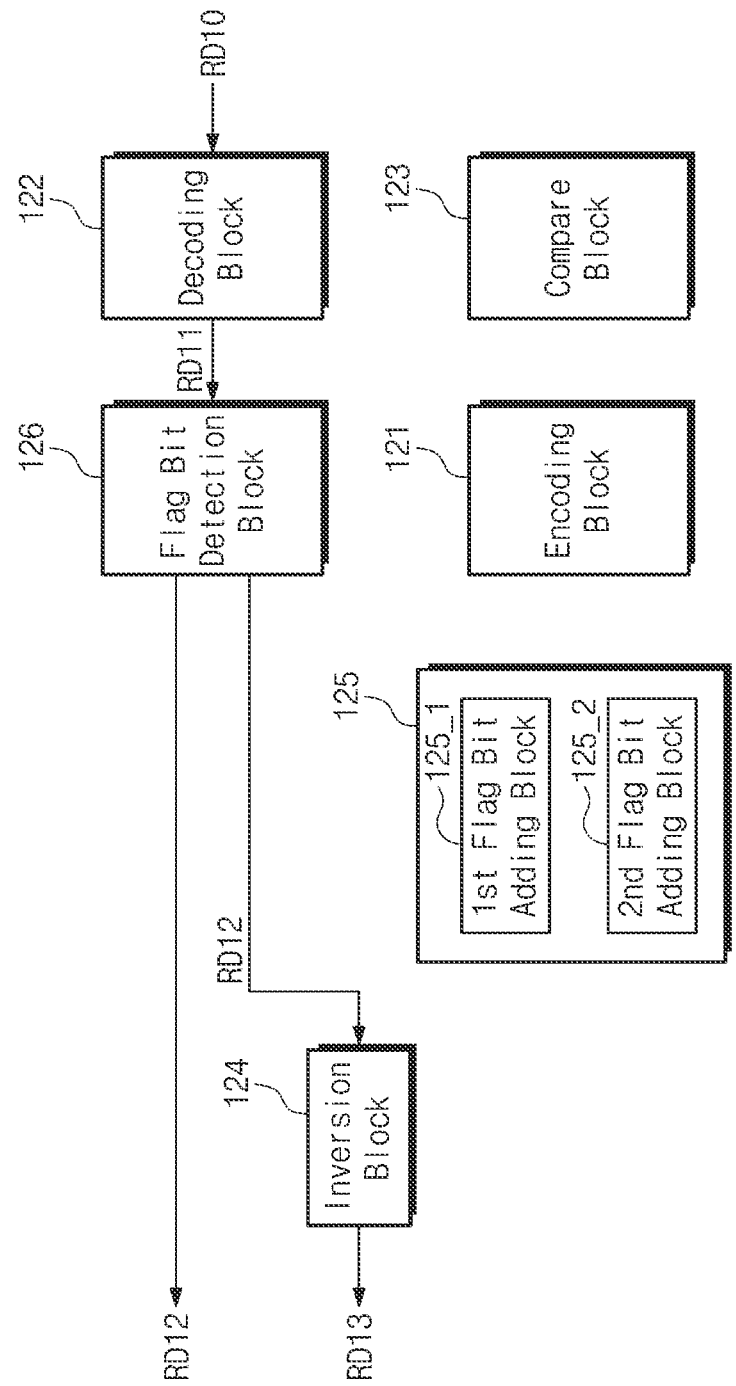
FIG. 11 illustrates an example in which a controller of FIG. 5 performs a read operation for reading data from a nonvolatile memory device.

FIG. 11 illustrates an example in which the controller 120a of FIG. 5 performs a read operation for reading data from the nonvolatile memory device 110a. Referring to FIGS. 5, 9, and 11, as described with reference to operation S345 and operation S350 of FIG. 9, the controller 120a receives tenth read data RD10 as eighth data DATA8 from the nonvolatile memory device 110a. The tenth read data RD10 is provided to the decoding block 122.

As described with reference to operation S355 of FIG. 9, the decoding block 122 performs error correction decoding on the tenth read data RD10 to generate eleventh read data RD11.

A described with reference to operation S360 of FIG. 9, the flag bit detection block 126 detects a flag bit (i.e., flag bits) from the eleventh read data RD11. The flag bit detection block 126 removes the flag bit from the eleventh read data RD11 to generate twelfth read data RD12.

When the flag bit indicates the non-inversion, the controller 120a may obtain the twelfth read data RD12 as a result of the read operation. When the flag bit indicates the inversion, the controller 120a provides the twelfth read data RD12 to the inversion block 124 (e.g., an inverter or inversion circuit). The inversion block 124 inverts the twelfth read data RD12 to generate thirteenth read data RD13. The controller 120a may obtain the thirteenth read data RD13 as a result of the read operation.

Figure 12:
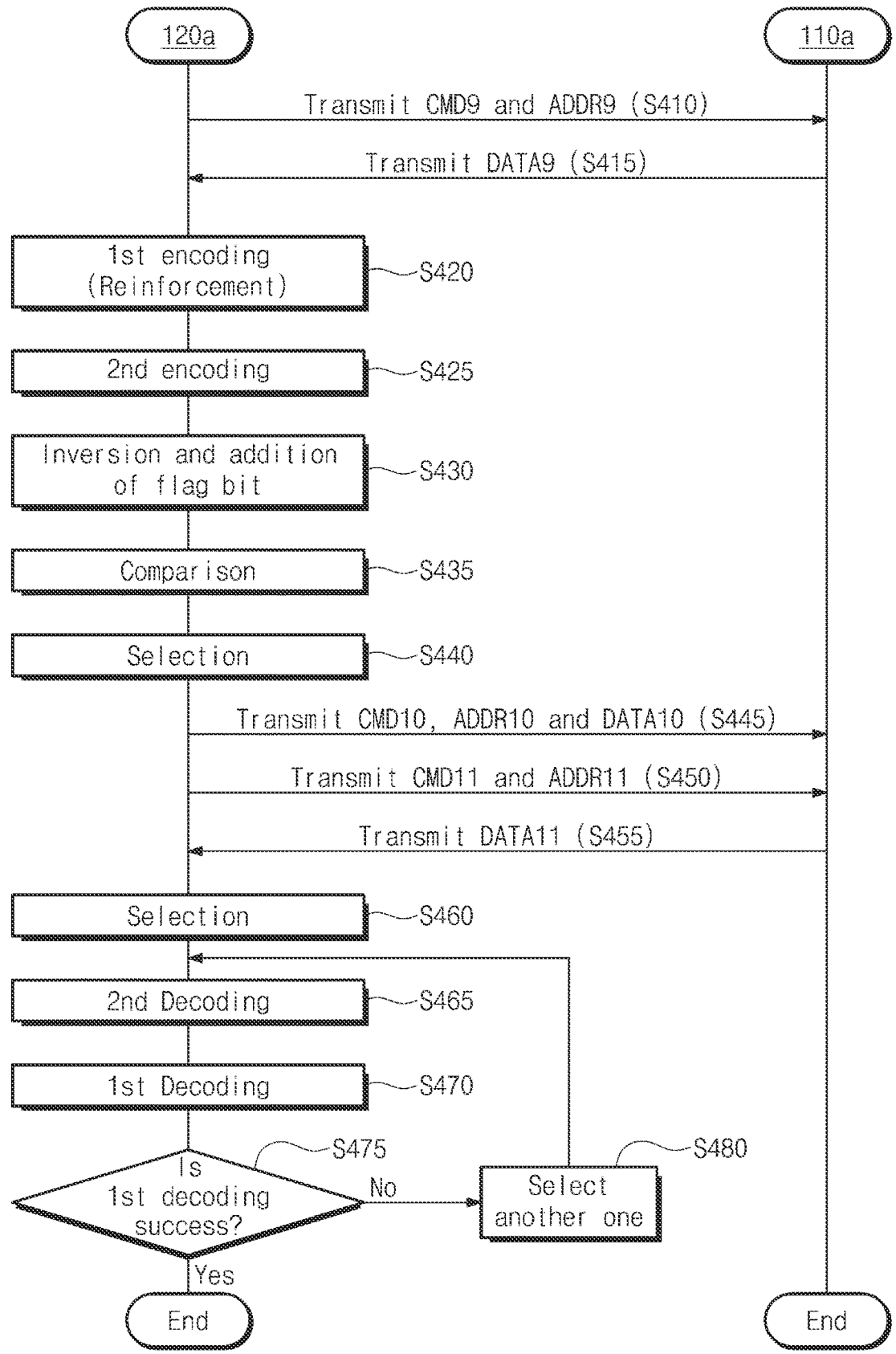
FIG. 12 is a flowchart illustrating another example of an operating method of a memory system of FIG. 5 according to an exemplary embodiment of the inventive concept.

FIG. 12 is a flowchart illustrating another example of an operating method of the memory system 100a of FIG. 5 according to an exemplary embodiment of the inventive concept. Referring to FIGS. 5 and 12, upon writing data in the nonvolatile memory device 110a, the controller 120a performs the compare and write operation. The compare and write operation may be performed through operation S410 to operation S445.

In operation S410 of the compare and write operation, the controller 120a transmits a ninth command CMD9 and a ninth address ADDR9 to the nonvolatile memory device 110a. The ninth command CMD9 may be a read command and may be transmitted for comparison. In operation S415 of the compare and write operation, the nonvolatile memory device 110a transmits ninth data DATA9 to the controller 120a.

In operation S420, the controller 120a performs first encoding on original data to be written in the nonvolatile memory device 110a. In operation S425, the controller 120a performs second encoding on a result of the first encoding. The second encoding is performed to correct an error which occurs while writing and reading original data in and from the nonvolatile memory device 110a.

The first encoding may be performed to determine whether current data is correct data, and to use one of various schemes for error detection or correction. For example, the first encoding may be based on a cyclic redundancy check (CRC).

Similar to operation S320 of FIG. 9, in operation S430, the controller 120a generates inverted data of data on which the second encoding is performed. The controller 120a may respectively add flag bits to the data experiencing the second encoding and the inverted data to generate first and second candidate data. As described with reference to FIGS. 5 to 8, the controller 120a may further add at least one replica flag bit.

In operation S435, the controller 120a compares the ninth data DATA9 with the first candidate data and the second candidate data to calculate hamming distances. In operation S440, the controller 120a selects the candidate data having a smaller hamming distance, based on a result of the comparison. Operation S435 and operation S440 may be identical to operation S235 and operation S240 of FIG. 6.

In operation S445, the controller 120a transmits a tenth command CMD10, a tenth address ADDR10, and tenth data DATA10 to the nonvolatile memory device 110a. The tenth command CMD10 may be a write command. The tenth address ADDR10 may indicate selected memory cells. In an exemplary embodiment, the tenth data DATA10 is the selected candidate data. The nonvolatile memory device 110a may write the tenth data DATA10 in the selected memory cells.

The read operation may be performed through operation S450 to operation S480. In operation S450, the controller 120a transmits an eleventh command CMD11 and an eleventh address ADDR11 to the nonvolatile memory device 110a. The eleventh command CMD11 may be a read command. In operation S455, the nonvolatile memory device 110a transmits eleventh data DATA11 read from memory cells selected by the eleventh address ADDR11 to the controller 120a.

In operation S460, the controller 120 may detect a flag bit from the eleventh data DATA11, and may select data obtained by removing the flag bit from the eleventh data DATA11 based on the flag bit or may select data obtained by removing the flag bit from the eleventh data DATA11 and inverting the resultant data. For example, if the eleventh data DATA11 is 12 bits, and the flag bit(s) is 2 bits, then the removal would result in 10 bit data. In this example, if the flag bit indicates no inversion, then the selected data would be the original 10 bit data, and if the flag bit indicates inversion, then the selected data would be an inverted version of the 10 bit data.

In operation S465, the controller 120a performs second decoding on the selected data. The second decoding may correspond to the second encoding of operation S425. The controller 120a may correct errors included in the selected data by performing the second decoding.

In operation S470, the controller 120a performs first decoding on the selected data. The first decoding may correspond to the first encoding of operation S420. The controller 120a may determine whether the selected data are correctly selected, by performing the first decoding. For example, the controller 120a may determine whether incorrect data is selected in operation S460 due to an error included in the flag bit.

When the first decoding succeeds, it is determined that correct data was selected. The controller 120a may obtain the data experiencing the first decoding as a result of the read operation. When the first decoding fails, it is determined that incorrect data was selected.

In operation S480, the controller 120a selects the other data not selected in operation S460. For example, if operation S460 selected original data without inversion and operation S470 indicates it was incorrect to make such a selection, then the controller 120a would select an inverted version of the original data as the other data. Afterwards, in operation S465 and operation S470, the controller 120a may sequentially perform the second decoding and the first decoding on the other data thus selected.

As described above, the controller 120a according to an embodiment of the inventive concept is configured to perform the first encoding and the first decoding which make it possible to determine whether incorrect data are selected due to an error of a flag bit. Integrity of data is reinforced by performing the first encoding and the first decoding in addition to the second encoding and the second decoding.

Figure 13:
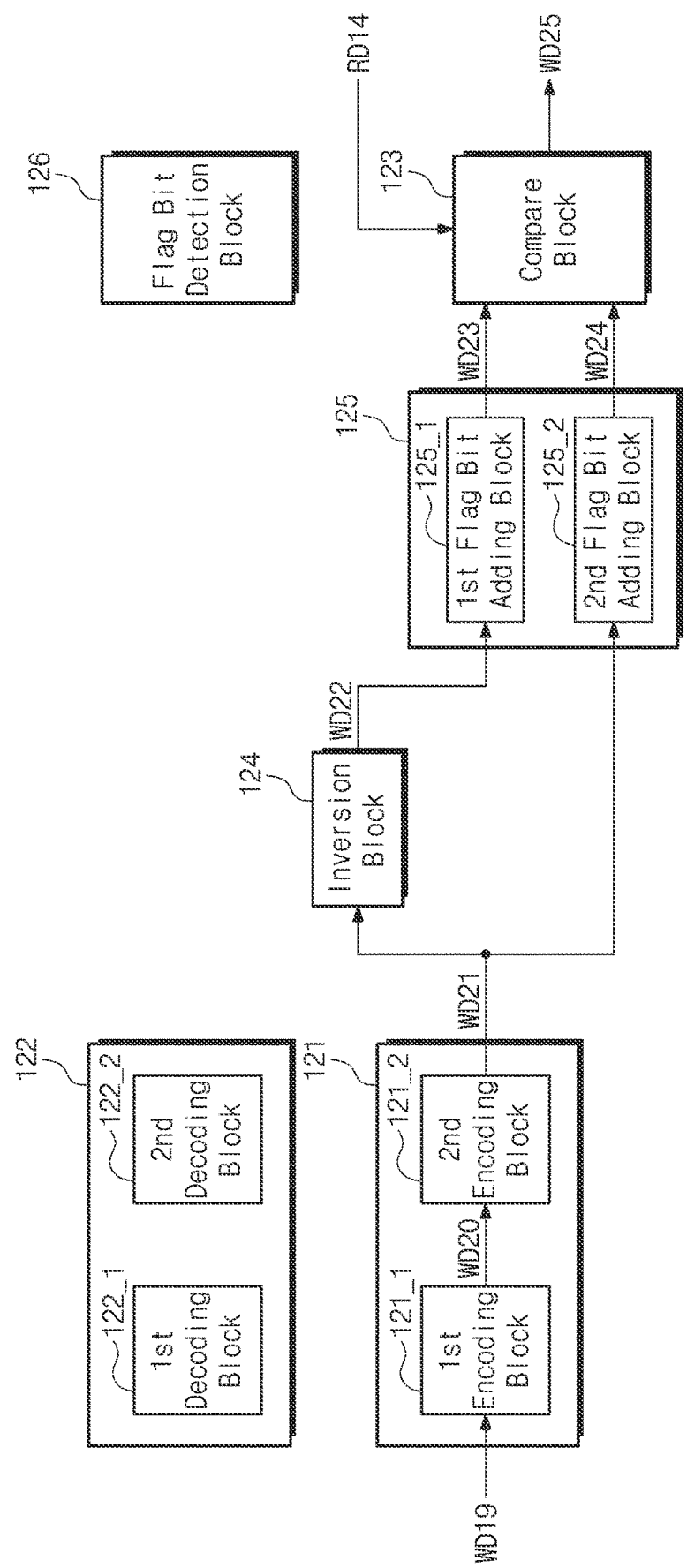
FIG. 13 illustrates an example in which a controller of FIG. 5 performs a compare and write operation for writing data in a nonvolatile memory device.

FIG. 13 illustrates an example in which the controller 120a of FIG. 5 performs a compare and write operation for writing data in the nonvolatile memory device 110a. Referring to FIGS. 5, 12, and 13, as described with reference to operation S410 and operation S415 of FIG. 12, the controller 120a receives fourteenth read data RD14 as ninth data DATA9 from the nonvolatile memory device 110a. The fourteenth read data RD14 is provided to the compare block 123 without passing through the flag bit detection block 126.

The encoding block 121 includes a first encoding block 121_1 and a second encoding block 121_2. As described with reference to operation S420 of FIG. 12, the first encoding block 121_1 performs the first encoding on nineteenth write data WD19 to generate twentieth write data WD20. The twentieth write data WD20 is original data to be written in the nonvolatile memory device 110a.

As described with reference to operation S430 of FIG. 12, the second encoding block 121_2 performs the second encoding on the twentieth write data WD20 to generate twenty-first write data WD21.

As described with reference to operation S430 of FIG. 12, the inversion block 124 inverts twenty-first write data WD21 to generate twenty-second write data WD22. The first flag bit adding block 125_1 adds a flag bit to the twenty-second write data WD22 to generate twenty-third write data WD23 as a first candidate data. The second flag bit adding block 125_2 adds a flag bit to the twenty-first write data WD21 to generate twenty-fourth write data WD24 as a second candidate data.

As described with reference to operation S435 and operation S440 of FIG. 9, the compare block 123 compares the fourteenth read data RD14 with the twenty-third and twenty-fourth write data WD23 and WD24 and selects one of the twenty-third and twenty-fourth write data WD23 and WD24 as twenty-fifth write data WD25 based on a result of the comparison. As described with reference to operation S445 of FIG. 9, the controller 120a may transmit the twenty-five write data WD25 as tenth data DATA10 to the nonvolatile memory device 110a.

Figure 14:
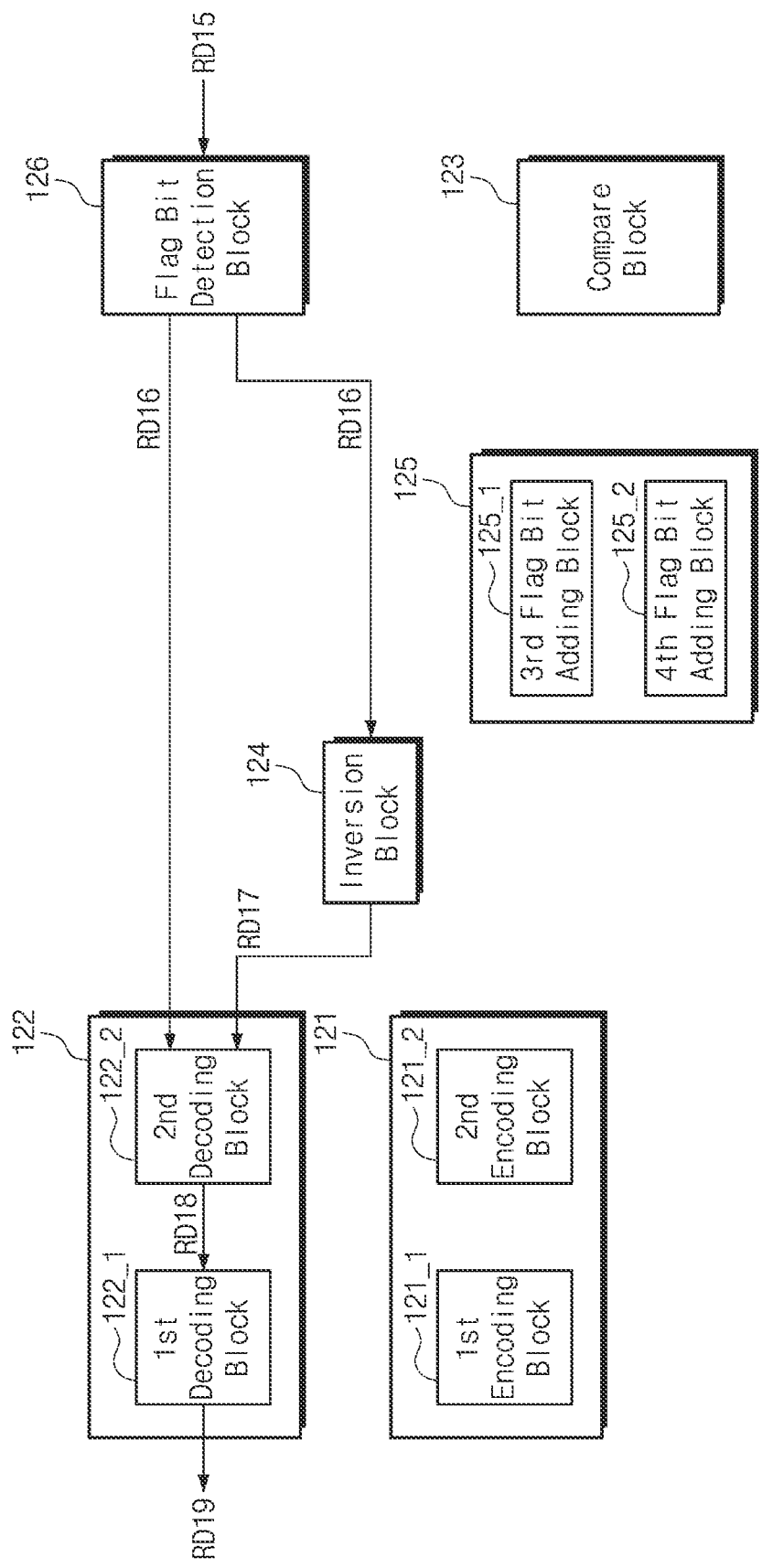
FIG. 14 illustrates an example in which a controller of FIG. 5 performs a read operation for reading data from a nonvolatile memory device.

FIG. 14 illustrates an example in which the controller 120a of FIG. 5 performs a read operation for reading data from the nonvolatile memory device 110a. Referring to FIGS. 5, 12, and 14, as described with reference to operation S450 and operation S455 of FIG. 12, the controller 120a receives fifteenth read data RD15 as eleventh data DATA11 from the nonvolatile memory device 110a. The fifteenth read data RD15 is provided to the flag bit detection block 126.

As described with reference to operation S460 of FIG. 12, the flag bit detection block 126 detects a flag bit (i.e., flag bits) from the fifteenth read data RD15. The flag bit detection block 126 removes the flag bit from the fifteenth read data RD15 to generate sixteenth read data RD16.

When the flag bit indicates the non-inversion, the flag bit detection block 126 provides the sixteenth read data RD16 to the decoding block 122. When the flag bit indicates the inversion, the flag bit detection block 126 provides the sixteenth read data RD16 to the inversion block 124. The inversion block 124 inverts the sixteenth read data RD16 to generate seventeenth read data RD17. The seventeenth read data RD17 is provided to the decoding block 122.

The decoding block 122 includes a first decoding block 122_1 and a second decoding block 122_2. As described with reference to operation S465 of FIG. 12, the second decoding block 122_2 performs the second decoding on the sixteenth read data RD16 or the seventeenth read data RD17 to generate eighteenth read data RD18.

As described with reference to operation S470 of FIG. 12, the first decoding block 122_1 performs the first decoding on the eighteenth read data RD18. When the first decoding succeeds, the controller 120a obtains the nineteenth read data RD19 as a result of the first decoding as a result of the read operation. When the first decoding fails, the controller 120a controls the decoding block 122 so as to perform the second decoding on the other data (e.g., one of the sixteenth read data RD16 and the seventeenth read data RD17).

In an embodiment, when the first decoding fails in both the sixteenth read data RD16 and the seventeenth read data RD17, the controller 120a outputs both a result of the first decoding associated with the sixteenth read data RD16 and a result of the first decoding associated with the seventeenth read data RD17.

In an embodiment, the encoding block 121 and the decoding block 122 described with reference to FIGS. 1 to 11, may be configured to perform stepwise encoding and decoding as described with reference to FIGS. 12 to 14.

In FIGS. 5 to 14, a description is given assuming the encoding block 121 and the decoding block 122 are located within the controller 120a. However, the encoding block 121 and the decoding block 122 may be instead located within the nonvolatile memory device 110a. Components of the controller 120a may be located within the nonvolatile memory device 110a. Functions and operations which are described as being performed by the controller 120a may be performed by the nonvolatile memory device 110a.

Figure 15:
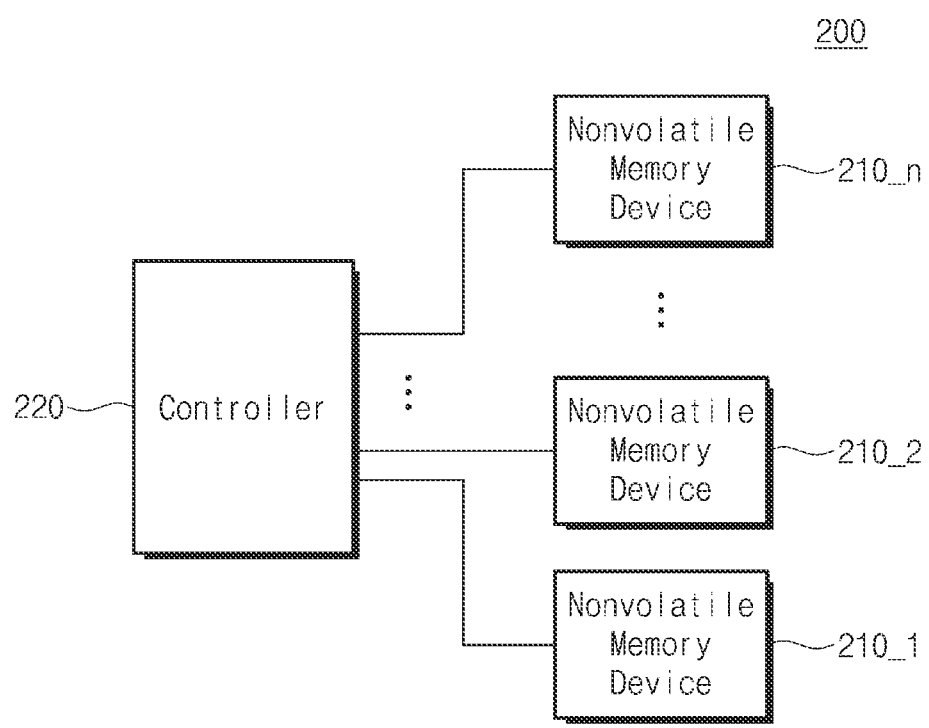
FIG. 15 illustrates a memory system according to an application example of the inventive concept.

FIG. 15 illustrates a memory system 200 according to an application example of the inventive concept. Referring to FIG. 15, the memory system 200 includes nonvolatile memory devices 210_1 to 210_n and a controller 220 (e.g., a control circuit).

In an embodiment, the controller 220 performs the compare and write operation on each of the nonvolatile memory devices 210_1 to 210_n. Each of the nonvolatile memory devices 210_1 to 210_n may store a flag bit(s).

In another example, the controller 220 performs the compare and write operation on two or more nonvolatile memory devices. A flag bit indicating whether data to be written in the two or more nonvolatile memory devices are inverted may be generated.

According to embodiments of the inventive concept, power consumption is reduced in a write operation through a compare and write operation. Also, according to embodiments of the inventive concept, integrity of written data and flag information is improved through a reinforcement operation.

While the inventive concept has been described with reference to exemplary embodiments thereof, it will be apparent to those of ordinary skill in the art that various changes and modifications may be made thereto without departing from the spirit and scope of the inventive concept.

What is claimed is:

1. A nonvolatile memory device comprising:
a plurality of memory cells;
a read circuit configured to receive first read data and second read data from the plurality of memory cells;
an inversion circuit configured to receive first write data from an external device, and to invert the first write data to generate second write data;
a flag bit adding circuit configured to receive the first write data from the external device and the second write data from the inversion circuit, to add a first flag bit to the second write data to generate third write data, and to add a second flag bit to the first write data to generate fourth write data;
a compare and write circuit configured to receive the first read data, the third write data and the fourth write data, to perform a first comparison between the first read data and the third write data, to perform a second comparison between the first read data and the fourth write data, to select one of the third write data and the fourth write data based on a result of the first comparison and the second comparison, and to write the selected one of the third write data and the fourth write data in the plurality of memory cells, wherein the invert of the first write data occurs regardless of the second comparison; and
a flag bit detection circuit configured to receive the second read data from the read circuit, and determine whether to invert the second read data from at least one flag bit of the second read data,
wherein the flag bit detection circuit is configured to output the second read data to the external device when it is determined that the second read data is not to be inverted,
wherein the flag bit detection circuit is configured to generate third read data by removing the at least one flag bit from the second read data and output the third read data to the inversion circuit, the inversion circuit is configured to invert the third read data to generate fourth read data, and the inversion circuit is configured to output the fourth read data to the external device when it is determined that the second read data is to be inverted.

2. The nonvolatile memory device of claim 1, wherein the nonvolatile memory device either outputs the second read data, or outputs the third read data, inverted data of the third read data, or both the third read data and the inverted data of the third read data.

3. The nonvolatile memory device of claim 1, wherein the flag bit adding circuit adds a first replica flag bit to the third write data, and adds a second replica flag bit to the fourth write data.

4. The nonvolatile memory device of claim 3, wherein the first replica flag bit is identical to the first flag bit, and the second replica flag bit is identical to the second flag bit.

5. The nonvolatile memory device of claim 1, wherein the flag bit detection circuit removes at least one replica flag bit from the second read data to generate the third read data.

6. A nonvolatile memory device comprising:
a plurality of memory cells;
an inversion circuit configured to receive first write data from an external device, and to invert the first write data to generate second write data;
a flag bit adding circuit configured to receive the first write data from the external device and the second write data from the inversion circuit, to add a first flag bit to the second write data to generate third write data, and to add a second flag bit to the first write data to generate fourth write data; and
a compare and write circuit configured to receive first read data stored in the plurality of memory cells, the third write data and the fourth write data, to perform a first comparison between the first read data and the third write data including the first flag bit, to perform a second comparison between the first read data and the fourth write data including the second flag bit, to select one of the third write data including the first flag bit and the fourth write data including the second flag bit based on a result of the first comparison and the second comparison, and to write the selected one of the third write including the first flag bit and the fourth write data including the second flag bit in the plurality of memory cells,
wherein the invert of the first write data occurs before the first comparison,
wherein both the first comparison and the second comparison occur after the flag bit adding circuit outputs both the third write data including the first flag bit and the fourth write data including the second flag bit to the compare and write circuit.

7. The nonvolatile memory device of claim 6, further comprising a read circuit configured to receive the first read data from the plurality of memory cells.

8. The nonvolatile memory device of claim 6, further comprising a flag bit detection circuit configured to receive second read data stored in the plurality of memory cells, wherein the flag bit detection circuit either outputs the second read data, or generates third read data by removing at least one flag bit from the second read data and provides the third read data to the inversion circuit.

9. The nonvolatile memory device of claim 8, wherein if the inversion circuit receives the third read data from the flag bit detection circuit, the inversion circuit is configured to invert the third read data to generate fourth read data, and configured to output the fourth read data to the external device.

10. The nonvolatile memory device of claim 8, wherein the flag bit detection circuit removes at least one replica flag bit from the second read data to generate the third read data.

11. The nonvolatile memory device of claim 6, wherein the flag bit adding circuit adds a first replica flag bit to the third write data, and adds a second replica flag bit to the fourth write data.

12. The nonvolatile memory device of claim 11, wherein the first replica flag bit is identical to the first flag bit, and the second replica flag bit is identical to the second flag bit.

13. A nonvolatile memory device comprising:
a plurality of memory cells;
an inversion circuit configured to receive first write data, and to invert the first write data to generate second write data;
a flag bit adding circuit configured to receive the first write data and the second write data, to add a first flag bit to the second write data to generate third write data including the first flag bit, and to add a second flag bit to the first write data to generate fourth write data including the second flag bit; and
a compare and write circuit configured to receive the third write data including the first flag bit and the fourth write data including the second flag bit, to perform a first comparison between a first read data and the third write data including the first flag bit, to perform a second comparison between the first read data and the fourth write data including the second flag bit, to select one of the third write data including the first flag bit and the fourth write data including the second flag bit based on a result of the first comparison and the second comparison, and to write the selected one of the third write data including the first flag bit and the fourth write data including the second flag bit in the plurality of memory cells,
wherein both the first comparison and the second comparison occur after the flag bit adding circuit outputs both the third write data including the first flag bit and the fourth write data including the second flag bit to the compare and write circuit.

14. The nonvolatile memory device of claim 13, further comprising a read circuit configured to receive the first read data and second read data from the plurality of memory cells.

15. The nonvolatile memory device of claim 13, wherein the compare and write circuit receives the first read data stored in the plurality of memory cells, performs a first comparison between the first read data and the third write data, and performs a second comparison between the first read data and the fourth write data, and the compare and write circuit selects the one of the third write data and the fourth write data based on a result of the first comparison and the second comparison.

16. The nonvolatile memory device of claim 13, further comprising a flag bit detection circuit configured to receive second read data stored in the plurality of memory cells, wherein the flag bit detection circuit either outputs the second read data, or generates third read data by removing at least one flag bit from the second read data and provides the third read data to the inversion circuit.

17. The nonvolatile memory device of claim 16, wherein if the inversion circuit receives the third read data from the flag bit detection circuit, the inversion circuit is configured to invert the third read data to generate fourth read data, and configured to output the fourth read data to an external device.

18. The nonvolatile memory device of claim 16, wherein the flag bit detection circuit removes at least one replica flag bit from the second read data to generate the third read data.

19. The nonvolatile memory device of claim 13, wherein the flag bit adding circuit adds a first replica flag bit to the third write data, and adds a second replica flag bit to the fourth write data.

20. The nonvolatile memory device of claim 19, wherein the first replica flag bit is identical to the first flag bit, and the second replica flag bit is identical to the second flag bit.

* * * * *